United States Patent
Liaw

(10) Patent No.: US 10,068,905 B2
(45) Date of Patent: *Sep. 4, 2018

(54) APPARATUS FOR FINFETS

(71) Applicant: Taiwan Semiconductor Manufacturing Company, Ltd., Hsin-Chu (TW)

(72) Inventor: Jhon-Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/178,045

(22) Filed: Jun. 9, 2016

(65) Prior Publication Data

US 2016/0293604 A1  Oct. 6, 2016

Related U.S. Application Data

(62) Division of application No. 13/446,199, filed on Apr. 13, 2012, now Pat. No. 9,368,388.

(51) Int. Cl.
| | |
|---|---|
| *H01L 27/088* | (2006.01) |
| *H01L 21/8244* | (2006.01) |
| *H01L 21/70* | (2006.01) |
| *H01L 27/092* | (2006.01) |
| *H01L 27/11* | (2006.01) |
| *H01L 21/8234* | (2006.01) |

(Continued)

(52) U.S. Cl.
CPC .... *H01L 27/0924* (2013.01); *H01L 21/76232* (2013.01); *H01L 21/823431* (2013.01); *H01L 27/1104* (2013.01); *H01L 29/66818* (2013.01); *H01L 29/7853* (2013.01)

(58) Field of Classification Search
CPC ..... H01L 2924/1437; H01L 21/823431; H01L 21/02236; H01L 21/3065; H01L 21/3086; H01L 21/76224; H01L 21/76232; H01L 27/0924; H01L 27/1104; H01L 29/66818; H01L 29/7853

See application file for complete search history.

(56) References Cited

U.S. PATENT DOCUMENTS

| | | |
|---|---|---|
| 8,263,451 B2 | 9/2012 | Su et al. |
| 8,264,021 B2 | 9/2012 | Lai et al. |

(Continued)

FOREIGN PATENT DOCUMENTS

| | | |
|---|---|---|
| CN | 102169853 A | 8/2011 |
| KR | 20070022977 A | 2/2007 |
| KR | 20110036505 A | 4/2011 |

*Primary Examiner* — Mark Tornow
*Assistant Examiner* — Priya Rampersaud
(74) *Attorney, Agent, or Firm* — Slater Matsil, LLP

(57) ABSTRACT

A device comprises a first inverter comprising a first p-type transistor (PU) and a first n-type transistor (PD), a second inverter cross-coupled to the first inverter comprising a second PU and a second PD, a first pass-gate transistor coupled between the first inverter and a first bit line and a second pass-gate transistor coupled between the second inverter and a second bit line, wherein at least one transistor has a two-stage fin structure, and wherein a width of a bottom portion of the two-stage fin structure is greater than a width of an upper portion of the two-stage fin structure.

20 Claims, 27 Drawing Sheets

(51) Int. Cl.
*H01L 29/66* (2006.01)
*H01L 29/78* (2006.01)
*H01L 21/762* (2006.01)

(56) References Cited

U.S. PATENT DOCUMENTS

| | | | |
|---|---|---|---|
| 2005/0035391 A1* | 2/2005 | Lee | H01L 21/26513 257/308 |
| 2005/0056888 A1* | 3/2005 | Youn | H01L 21/823437 257/331 |
| 2005/0156202 A1 | 7/2005 | Rhee et al. | |
| 2005/0224800 A1* | 10/2005 | Lindert | H01L 29/66795 257/66 |
| 2007/0048947 A1 | 3/2007 | Lee et al. | |
| 2007/0114612 A1* | 5/2007 | Ahn | H01L 27/11 257/364 |
| 2007/0158756 A1* | 7/2007 | Dreeskornfeld | H01L 21/823412 257/374 |
| 2008/0029821 A1* | 2/2008 | Yamagami | H01L 21/82380 257/365 |
| 2008/0102570 A1* | 5/2008 | Fischer | H01L 29/66818 438/157 |
| 2008/0296667 A1* | 12/2008 | Mikasa | H01L 29/66795 257/327 |
| 2008/0296702 A1 | 12/2008 | Lee et al. | |
| 2009/0061580 A1 | 3/2009 | Cheng et al. | |
| 2010/0163842 A1 | 7/2010 | Lai et al. | |
| 2011/0068400 A1* | 3/2011 | Wang | G11C 11/412 257/347 |
| 2011/0079829 A1 | 4/2011 | Lai et al. | |
| 2011/0127610 A1 | 6/2011 | Lee et al. | |
| 2011/0182098 A1* | 7/2011 | Liaw | G11C 11/412 365/51 |
| 2011/0210404 A1 | 9/2011 | Su et al. | |
| 2012/0001197 A1* | 1/2012 | Liaw | H01L 27/11 257/77 |
| 2012/0088349 A1* | 4/2012 | Tang | H01L 21/3086 438/424 |
| 2013/0141963 A1* | 6/2013 | Liaw | G11C 11/412 365/156 |
| 2013/0181297 A1* | 7/2013 | Liaw | G11C 11/412 257/390 |
| 2013/0200483 A1* | 8/2013 | Tung | H01L 21/3065 257/506 |
| 2013/0334606 A1* | 12/2013 | Shen | H01L 29/66818 257/368 |
| 2015/0014808 A1* | 1/2015 | Tsai | H01L 21/76224 257/506 |

* cited by examiner

APPARATUS FOR FINFETS

This application is a divisional of U.S. patent application Ser. No. 13/446,199, entitled "Apparatus for FinFETs," filed on Apr. 13, 2012, which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

In a complementary metal oxide semiconductor (CMOS) field effect transistor (FET), active regions include a drain, a source, a channel region connected between the drain and the source, and a gate on top of the channel to control the on and off state of the channel region. When the gate voltage is more than a threshold voltage, a conductive channel is established between the drain and the source. As a result, electrons or holes are allowed to move between the drain and source. On the other hand, when the gate voltage is less than the threshold voltage, ideally, the channel is cut off and there are no electrons or holes flowing between the drain and the source. However, as semiconductor devices keep shrinking, due to the short channel leakage effect, the gate cannot fully control the channel region, especially the portion of the channel region which is far away from the gate. As a consequence, after semiconductor devices are scaled into deep sub-30 nanometer dimensions, the corresponding short gate length of conventional planar transistors may lead to the inability of the gate to substantially turn off the channel region.

As semiconductor technologies evolve, fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, is rectangular in shape from a cross section view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 3-8 illustrate a method of fabricating a FinFET having a reverse T-shaped fin in accordance with an embodiment;

FIG. 3 illustrates a mask layer formed over a semiconductor substrate in accordance with an embodiment;

FIG. 4 illustrates the semiconductor device shown in FIG. 3 after an etching process has been applied to the semiconductor device;

FIG. 5 illustrates the semiconductor device shown in FIG. 4 after the mask layer has been removed;

FIG. 6 illustrates the semiconductor device shown in FIG. 5 after a second mask layer has been applied in accordance with an embodiment;

FIG. 8 illustrates the semiconductor device shown in FIG. 7A after a dielectric material has been filled in the openings between two adjacent fins in accordance with an embodiment;

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a fin field effect transistor (FinFET) having a reverse T-shaped channel region. The embodiments of the disclosure may also be applied, however, to a variety of semiconductor devices. Hereinafter, various embodiments will be explained in detail with reference to the accompanying drawings.

Figure 1:
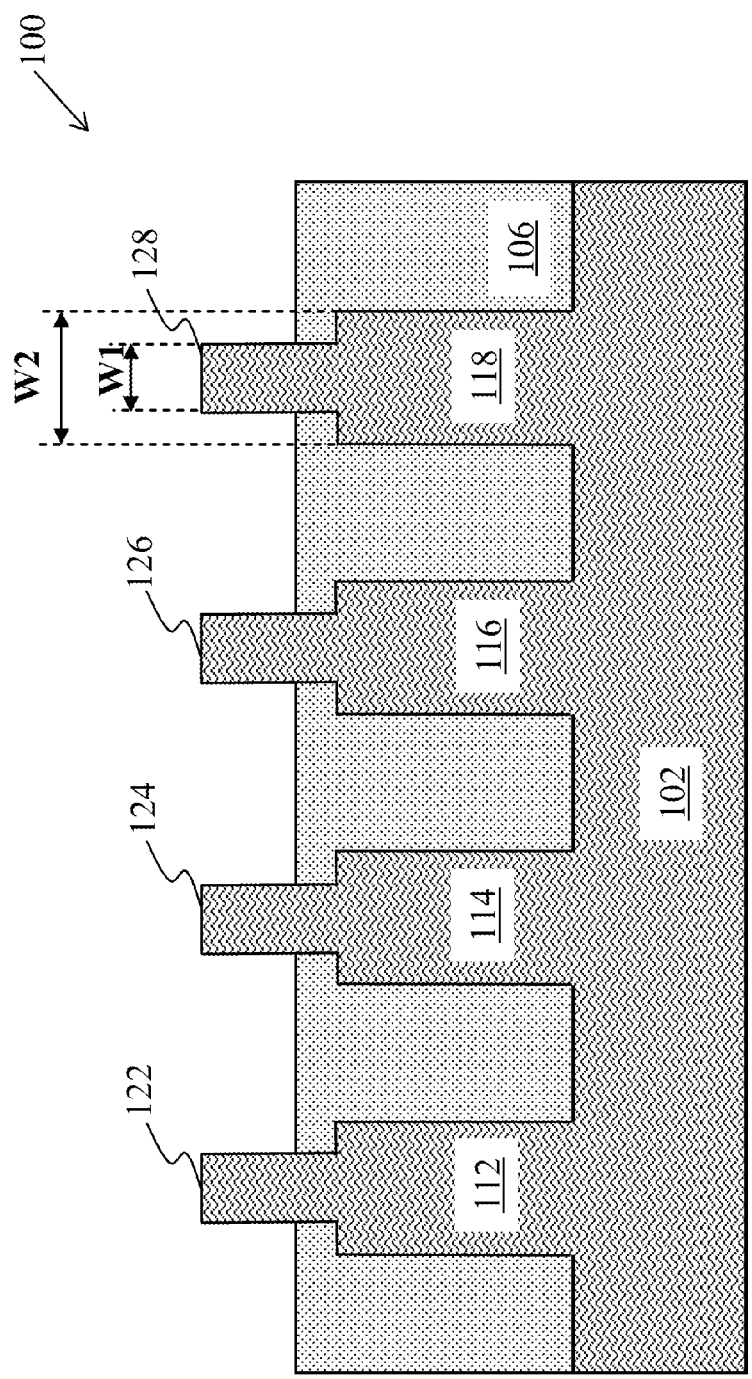
FIG. 1 illustrates a cross sectional view of channel regions of FinFETs having a reverse T-shaped channel region in accordance with an embodiment.

FIG. 1 illustrates a cross sectional view of channel regions of FinFETs having a reverse T-shaped channel region in accordance with an embodiment. The semiconductor device 100 may comprise four FinFETs formed over a substrate 102. The substrate 102 may be a silicon substrate. Alternatively, the substrate 102 may comprise other semiconductor materials such as germanium, compound semiconductor materials such as silicon carbide, gallium arsenide, indium arsenide, indium phosphide and the like. In accordance with an embodiment, the substrate 102 may be a crystalline structure. In accordance with another embodiment, the substrate 102 may be a silicon-on-insulator (SOI) substrate.

Each FinFET shown in FIG. 1 is of a reversed T shape from a cross sectional view of the channel region. More particularly, as shown in FIG. 1, each reverse T-shaped fin comprises an upper rectangle (e.g., upper rectangles 122, 124, 126 and 128) stacked on top of a bottom rectangle (e.g., bottom rectangles 112, 114, 116 and 118).

The width of the upper rectangle is labeled as W1 and the width of the bottom rectangle is labeled as W2. The actual dimensions of W1 and W2 are determined by the design rules and scale of the semiconductor process being used. In accordance with an embodiment, the ratio of W2 to W1 may be greater than or equal to 1.5. One advantageous feature of having a wider bottom rectangle is that the well resistance of the FinFET is improved because the wider width of the bottom rectangle helps to reduce the well resistance.

In accordance with an embodiment, in order to achieve better transistor threshold tuning, anti-punch through and well isolation, the upper portion of the upper rectangle (e.g., rectangle 122) and the upper portion of the bottom rectangle (e.g., rectangle 112) may have different doping concentrations. For example, the upper portion of the rectangle 112 may have a higher doping concentration than the upper portion of the rectangle 122.

As shown in FIG. 1, the reverse T-shaped fins are partially enclosed by an isolation region 106. More particularly, the bottom rectangles (e.g., bottom rectangle 112) are embedded in the isolation region 106. In accordance with an embodiment, the isolation 106 may be implemented by using a shallow trench isolation (STI) structure.

The STI structures (e.g., isolation region 106) may be fabricated by using suitable techniques including photolithography and etching processes. In particular, the photolithography and etching processes may comprise depositing a commonly used mask material such as photoresist over the substrate 102, exposing the mask material to a pattern, etching the substrate 102 in accordance with the pattern. In this manner, a plurality of openings may be formed as a result. The openings are then filled with dielectric materials to form the STI structures (e.g., isolation region 106). A chemical mechanical polishing (CMP) process is then performed to remove excess portions of the dielectric materials, and the remaining portions are the isolation region 106.

An advantageous feature of having a reverse T-shaped fin is that a reverse T-shaped fin provides a larger landing area for its corresponding contact plugs. As a result, the contact resistance can be reduced. Such reduced contact resistance helps to improve the speed and function of the FinFET having a reverse T-shaped fin.

Figure 2:
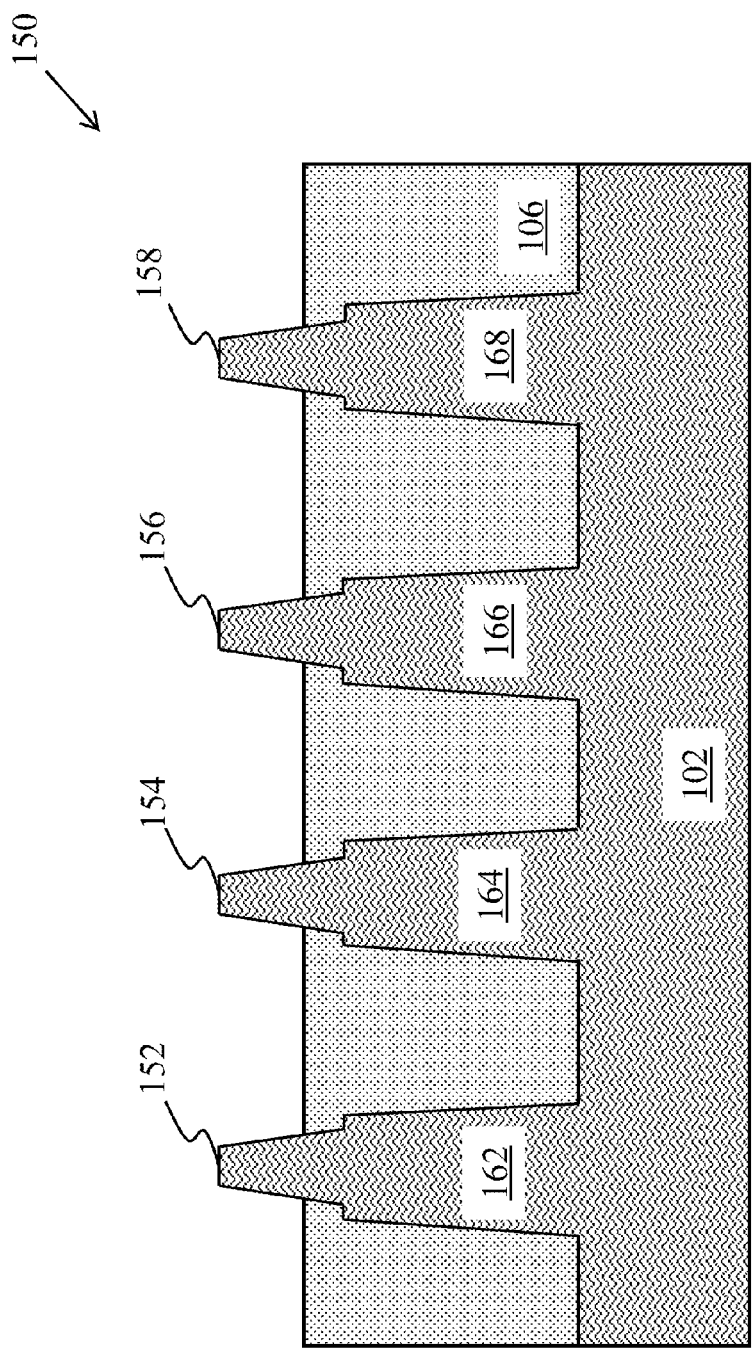
FIG. 2 illustrates a cross sectional view of channel regions of FinFETs having a reverse T-shaped fin in accordance with another embodiment.

FIG. 2 illustrates a cross sectional view of channel regions of FinFETs having a reverse T-shaped fin in accordance with another embodiment. The structure of the semiconductor device 150 is similar to the structure of the semiconductor device 100 shown in FIG. 1 except that the fin is formed by two trapezoidal regions. The cross sectional view of the channel regions shows each fin comprises an upper trapezoidal region (e.g., 152, 154, 156 and 158) stacked on a bottom trapezoidal region (e.g., 162, 164, 166 and 168). In accordance with an embodiment, the bottom interior angle of the upper trapezoidal regions (e.g., upper trapezoidal region 152) is in a range from about 84 degrees to about 90 degrees. Likewise, the bottom interior angle of the bottom trapezoidal regions (e.g., bottom trapezoidal region 162) is in a range from about 60 degrees to about 84 degrees.

It should be noted that the fin shape shown in FIG. 2 is merely an example, which should not unduly limit the scope of the claims. One of ordinary skill in the art would recognize many variations, alternatives, and modifications. For example, due to processing and operational variations, either the upper portion or the bottom portion may be of a shape similar to a trapezoid or a rectangle. A skilled person in the art will appreciate that a fin structure having a minor variation in shape is fully intended to be included within the scope of the present disclosure.

Figure 3:
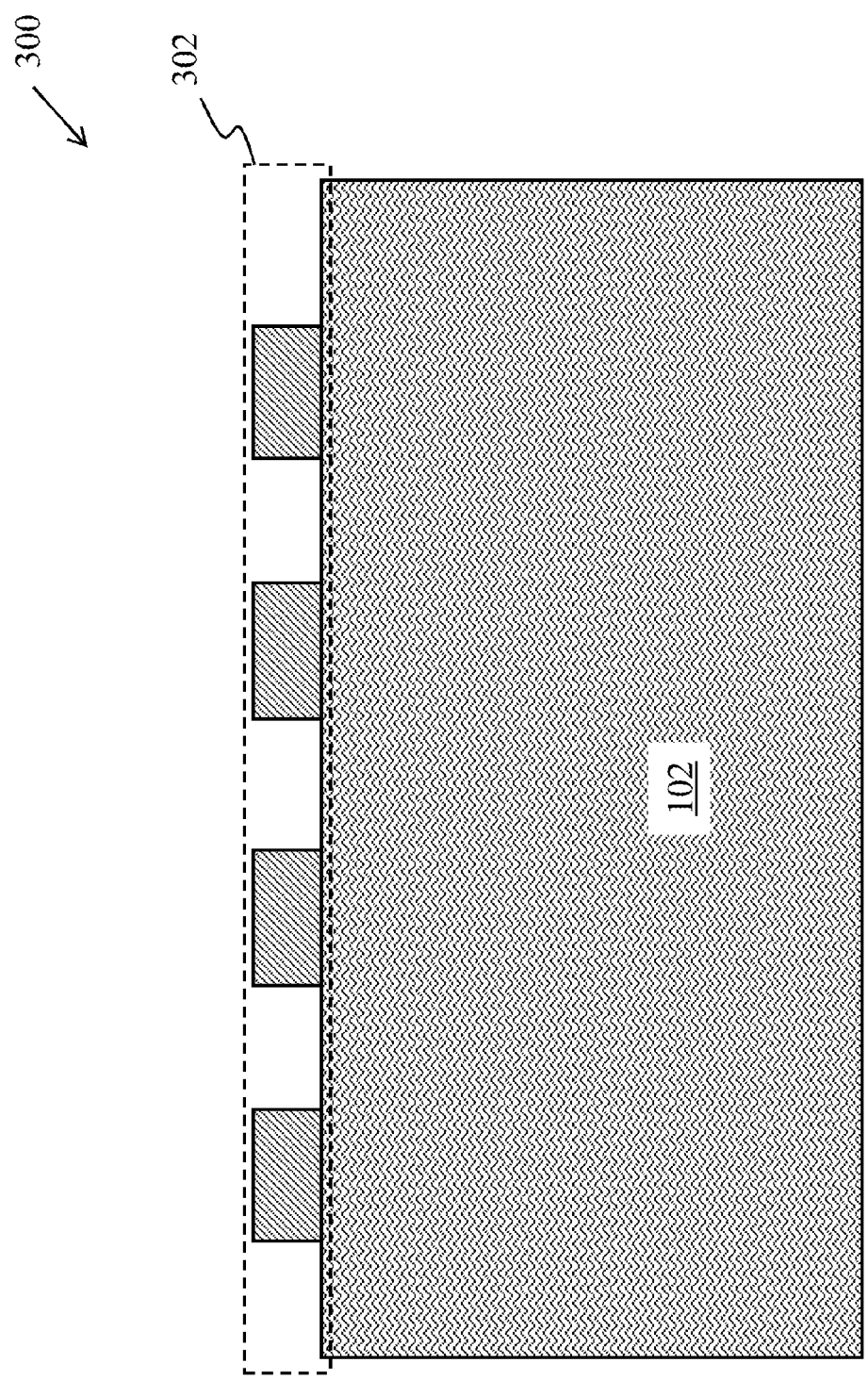

FIGS. 3-8 illustrate a method of fabricating a FinFET having a reverse T-shaped fin in accordance with an embodiment. FIG. 3 illustrates a mask layer formed over a semiconductor substrate in accordance with an embodiment. A mask layer 302 may be made of a photoresist material. The photoresist material is deposited over the substrate 102 using suitable techniques such as spin coating and the like. As shown in FIG. 3, the mask layer 302 is patterned according to a first fin profile. Referring back to FIG. 1, the first fin profile is used to define the horizontal dimension the bottom portion of the fin structure (e.g., the bottom rectangle 112) shown in FIG. 1.

After the mask layer 302 is patterned, there may be four photoresist material regions formed on top of the substrate 102. The remaining photoresist material of the mask layer 302 helps to prevent the substrate underneath the mask layer 302 from being etched away during the etching process described below with respect to FIG. 4.

Figure 4:
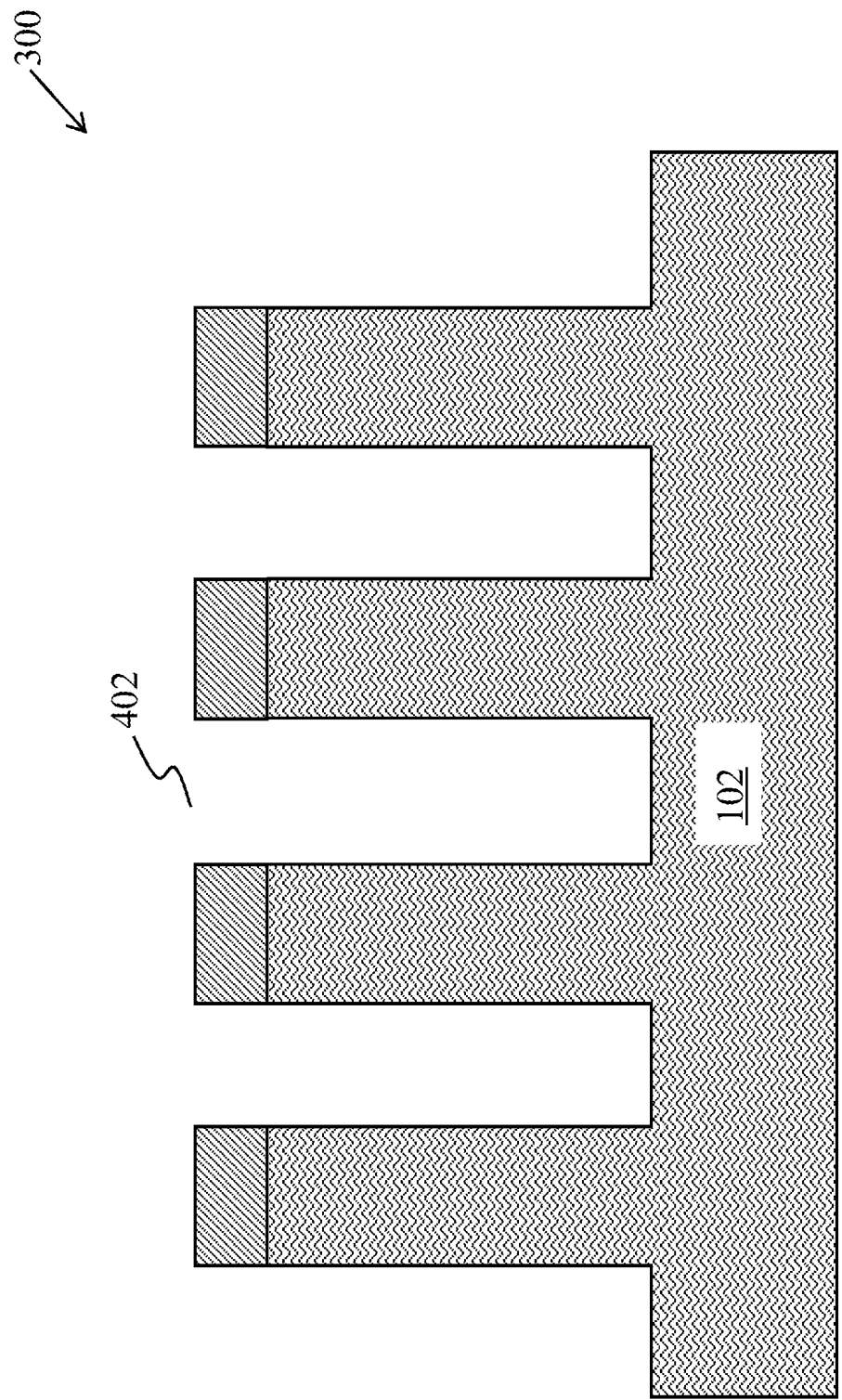

FIG. 4 illustrates the semiconductor device shown in FIG. 3 after an etching process has been applied to the semiconductor device. An etching process such as anisotropic etching is applied to the semiconductor device 300. According to the pattern shown in FIG. 3, the exposed portions of the substrate 102 are removed as a result. As shown in FIG. 4, the etching process leads to a plurality of openings 402 in the substrate 102.

Figure 5:
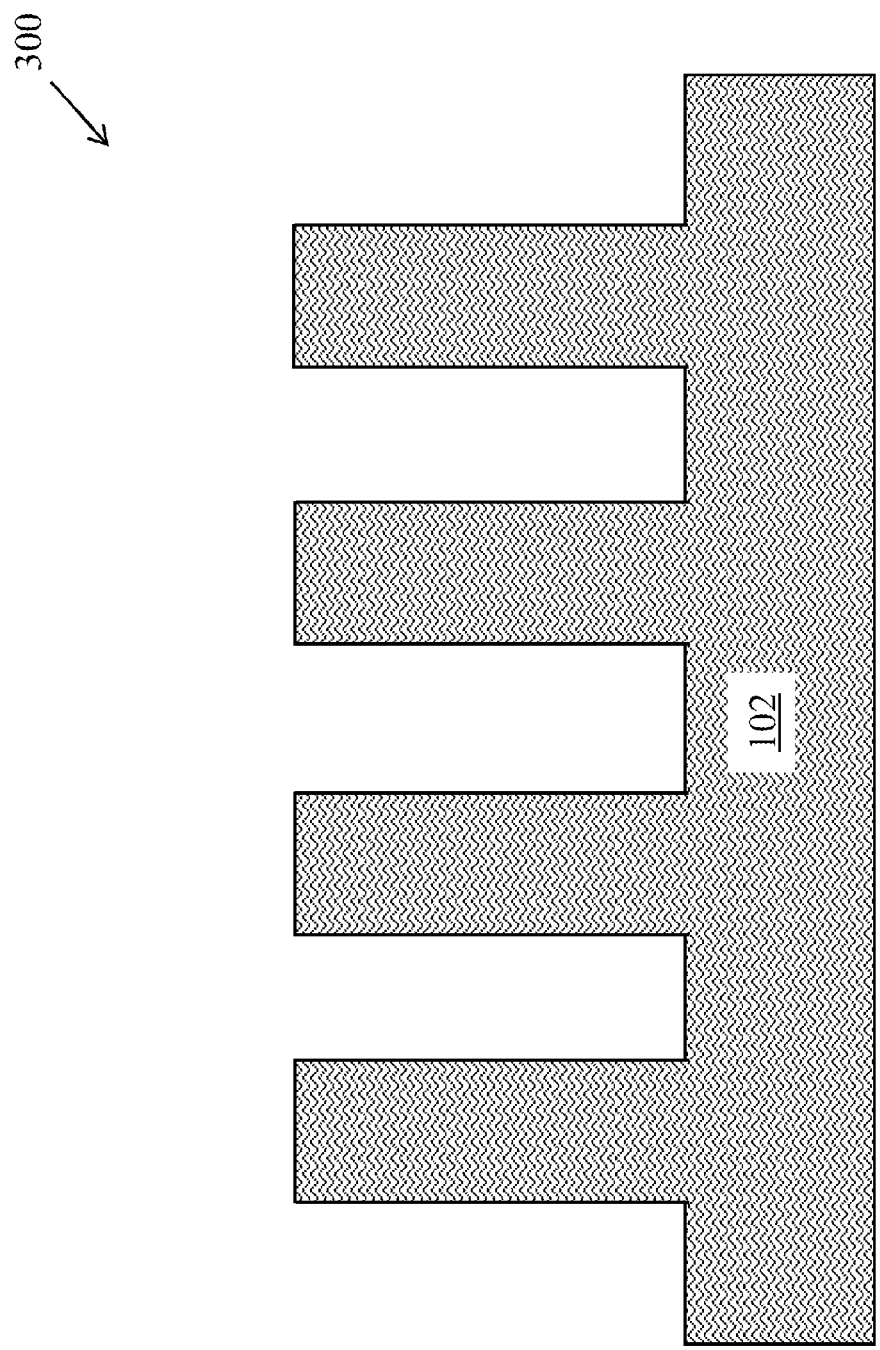

FIG. 5 illustrates the semiconductor device shown in FIG. 4 after the mask layer has been removed. The remaining photoresist material of the mask layer may be removed using suitable techniques. For example, a variety of solvents can be applied to the mask layer (illustrated in FIG. 4) to remove the remaining photoresist material. As shown in FIG. 5, there are four silicon fins protruding over the substrate 102. The silicon fins shown in FIG. 5 define a first fin profile for the FinFETs shown in FIG. 1.

Figure 6:
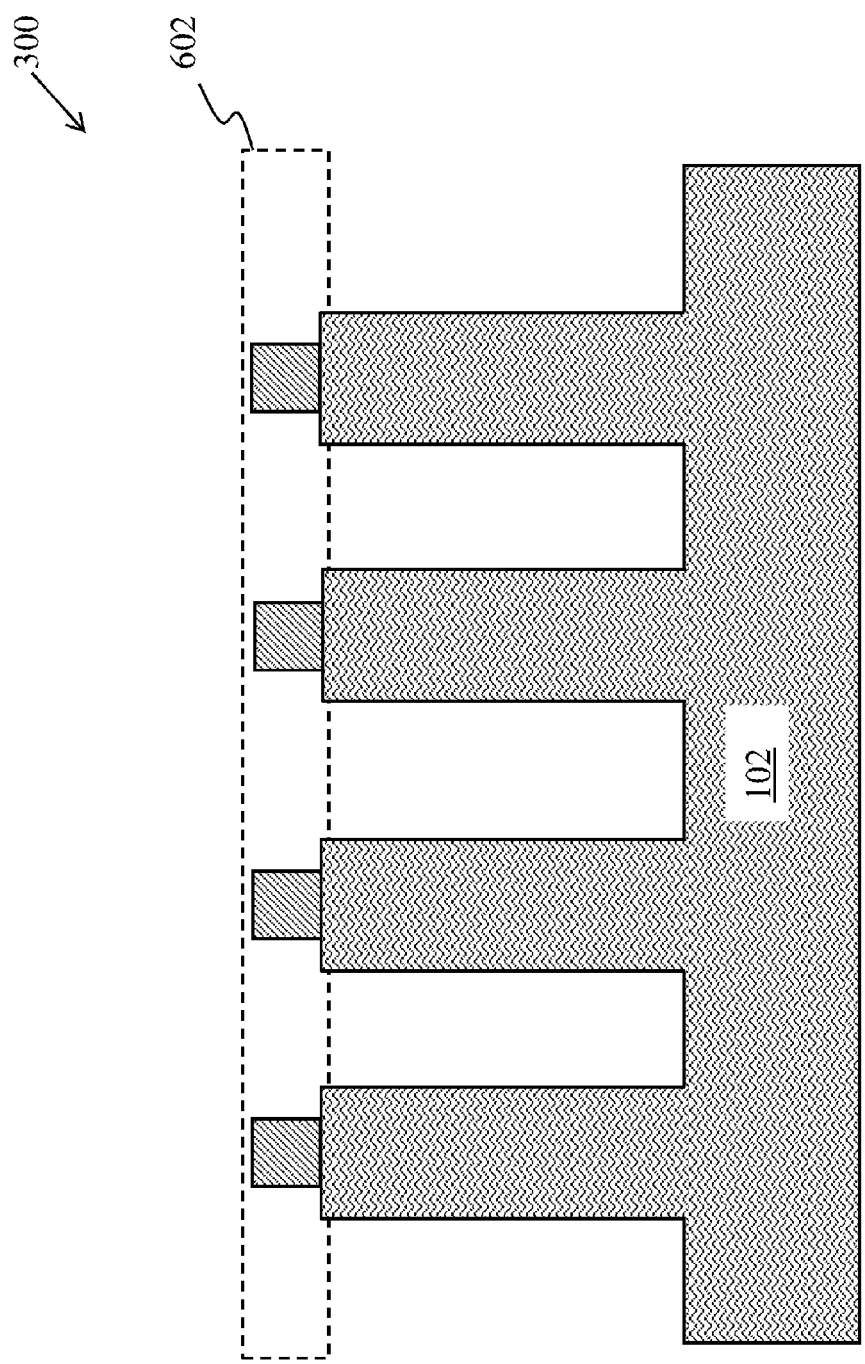

FIG. 6 illustrates the semiconductor device shown in FIG. 5 after a second mask layer has been applied in accordance with an embodiment. The second mask layer 602 is formed of a photoresist material. The second mask layer 602 is patterned according to the shape of the isolation region shown in FIG. 1.

Figure 7A:
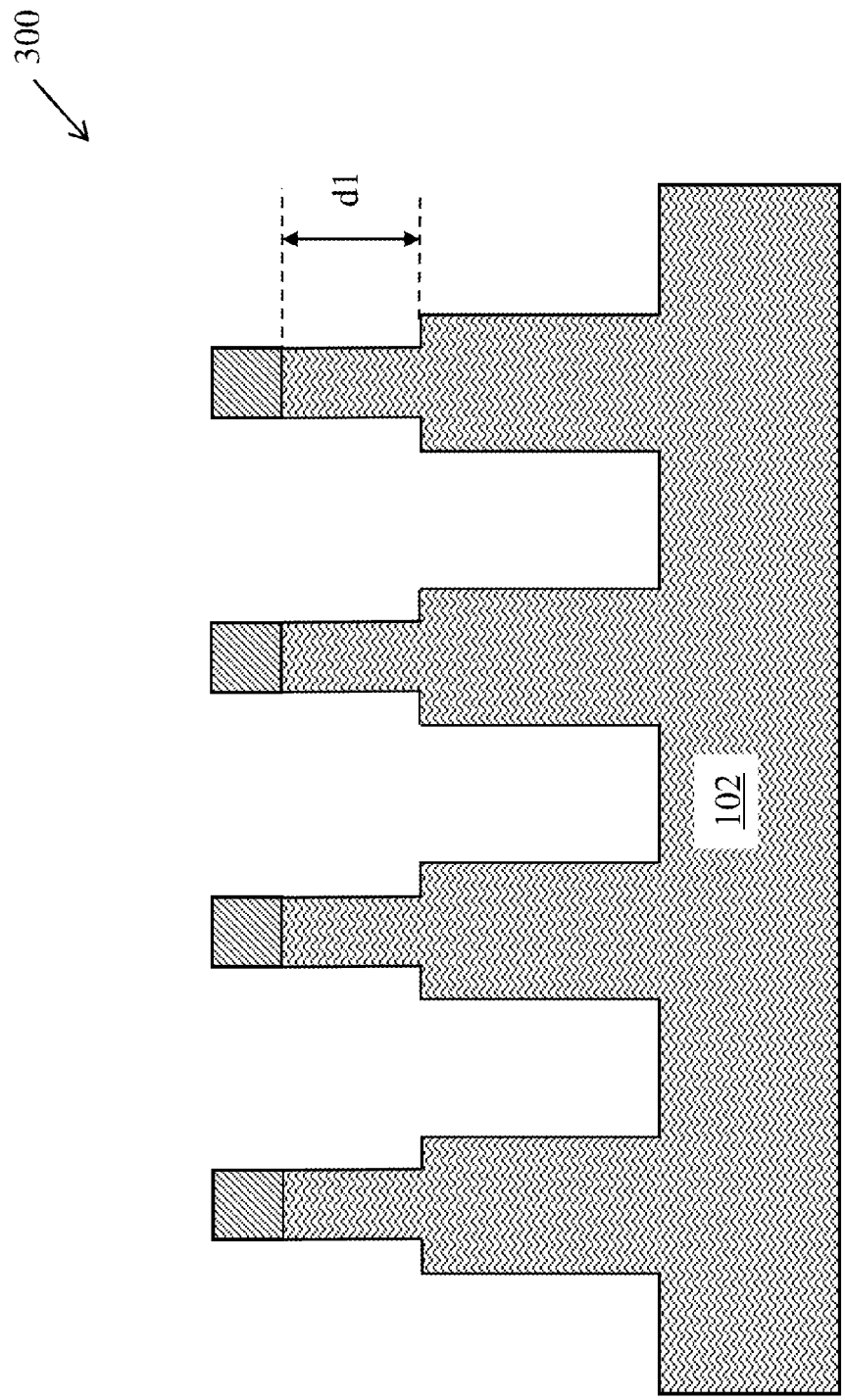
FIG. 7A illustrates the semiconductor device shown in FIG. 6 after an etching process has been applied in accordance with an embodiment.

FIG. 7A illustrates the semiconductor device shown in FIG. 6 after an etching process has been applied in accordance with an embodiment. An etching process such as anisotropic etching is applied to the semiconductor device 300. According to the pattern shown in FIG. 6, the exposed portions of the substrate 102 are removed as a result. In addition, the etching process is controlled such that the exposed portions of the substrate 102 are etched away to form a recess having a depth d1. In accordance with an embodiment, d1 is less than 600 Å. As shown in FIG. 7A, the etching process defines the shape of the isolation region between two adjacent fins.

It should be noted while FIG. 7A illustrates a method of fabricating the recess, a plurality of methods can be employed to recess the silicon so as to form the reverse T-shaped fin. For example, in FIG. 7B, a dielectric layer 702 may be formed in the openings shown in FIG. 6. The dielectric layer 702 may be polished so that the top surface of the dielectric layer 702 is coplanar with the top surface of the silicon fins. Then a mask layer is formed on the silicon fins and patterned according to the shape of the recess shown in FIG. 7A.

Figure 7B:
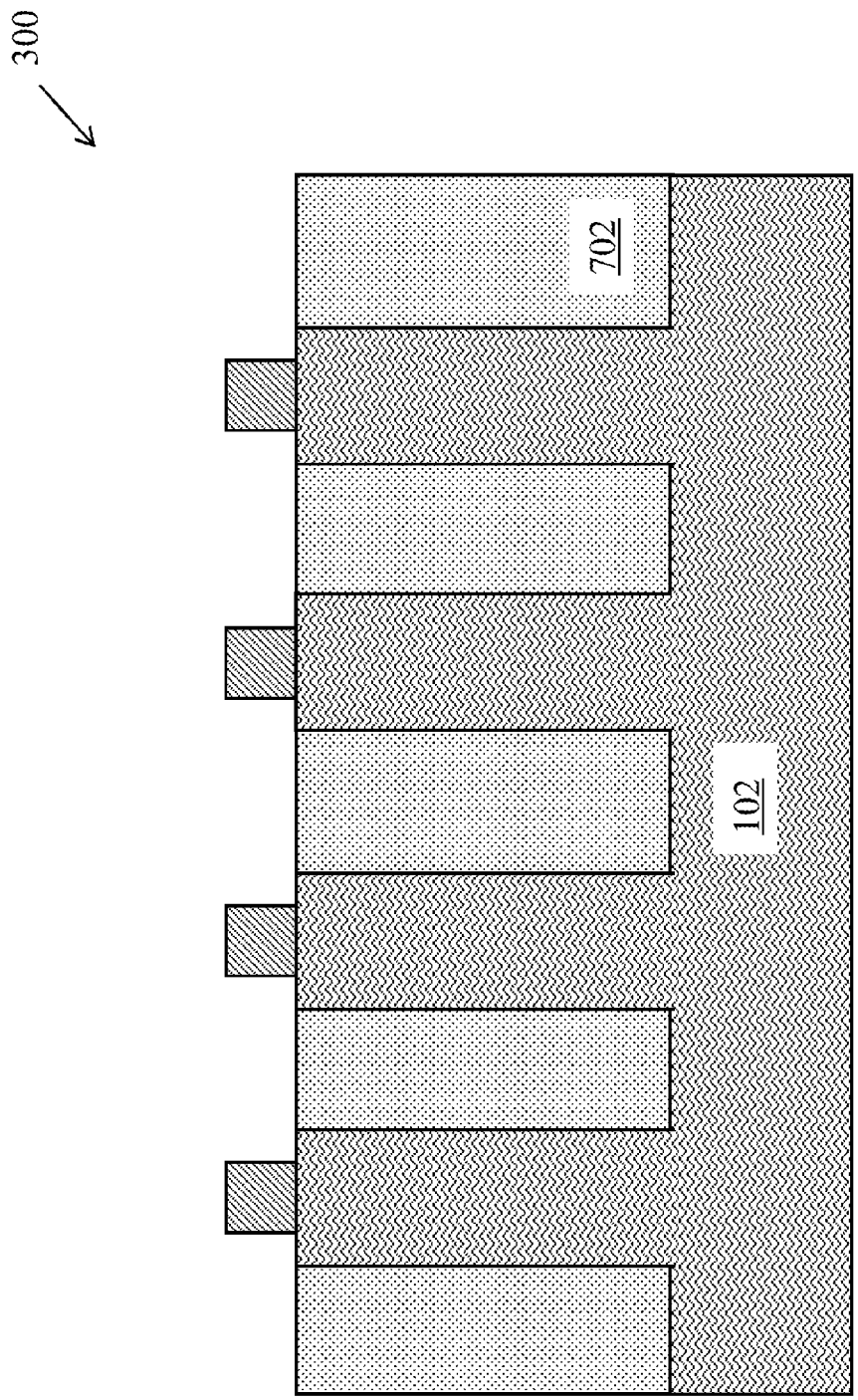
FIG. 7B illustrates a first step of a different method for fabricating the recess shown in FIG. 7A in accordance with an embodiment.
Figure 7C:
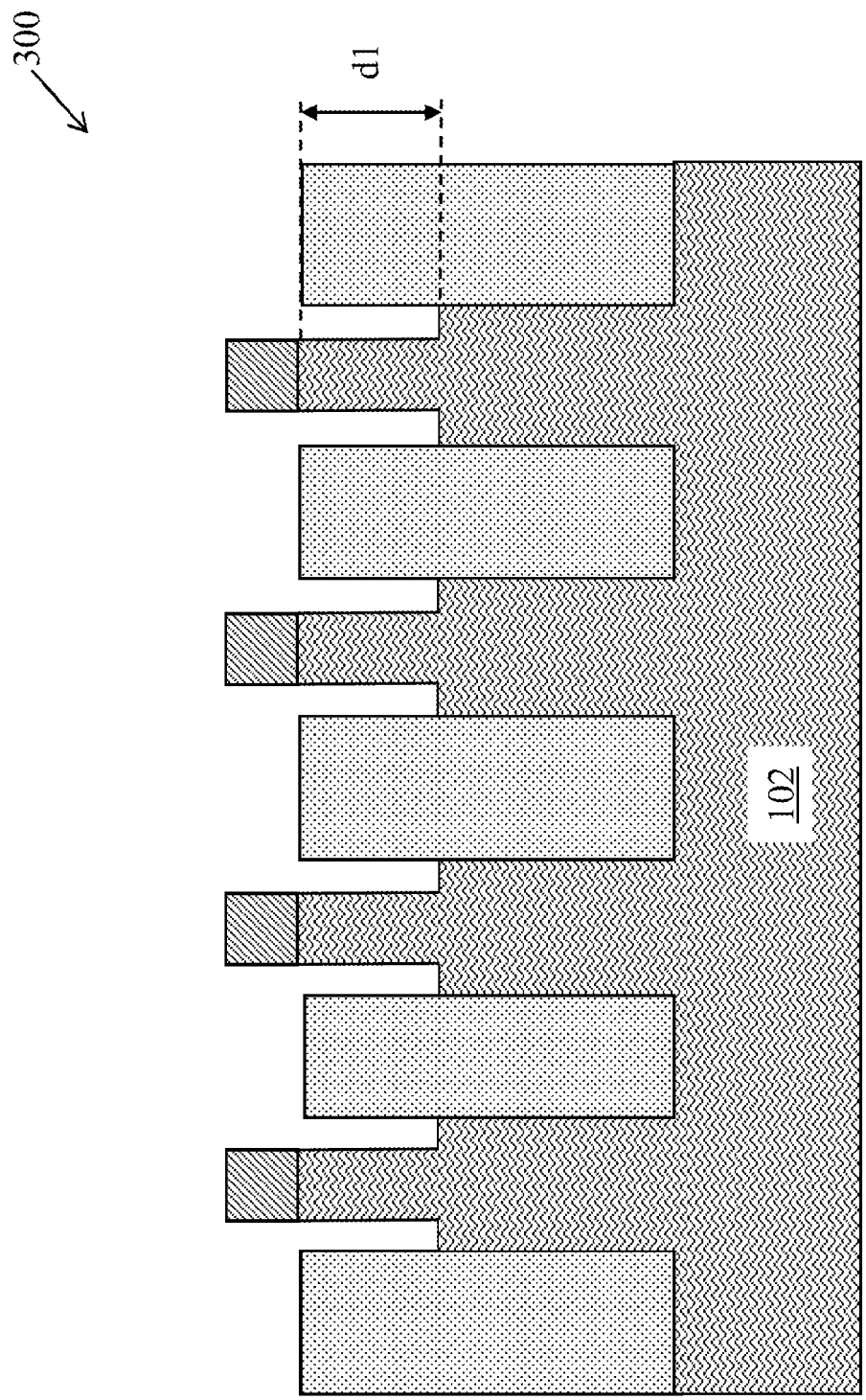
FIG. 7C illustrates a second step of a different method for fabricating the recess shown in FIG. 7A in accordance with an embodiment.

FIG. 7C illustrates the semiconductor device shown in FIG. 7B after an etching process has been applied in accordance with an embodiment. An etching process such as anisotropic etching is applied to the semiconductor device 300. According to the pattern shown in FIG. 7B, the exposed portions of the substrate 102 are removed as a result. The etching process is controlled such that the exposed portions of the substrate 102 are etched away to form a recess having a depth d1. In accordance with an embodiment, d1 is less than 600 Å. The dielectric layer 702 may be removed by using suitable techniques, leaving the reverse T-shaped fins.

Figure 8:
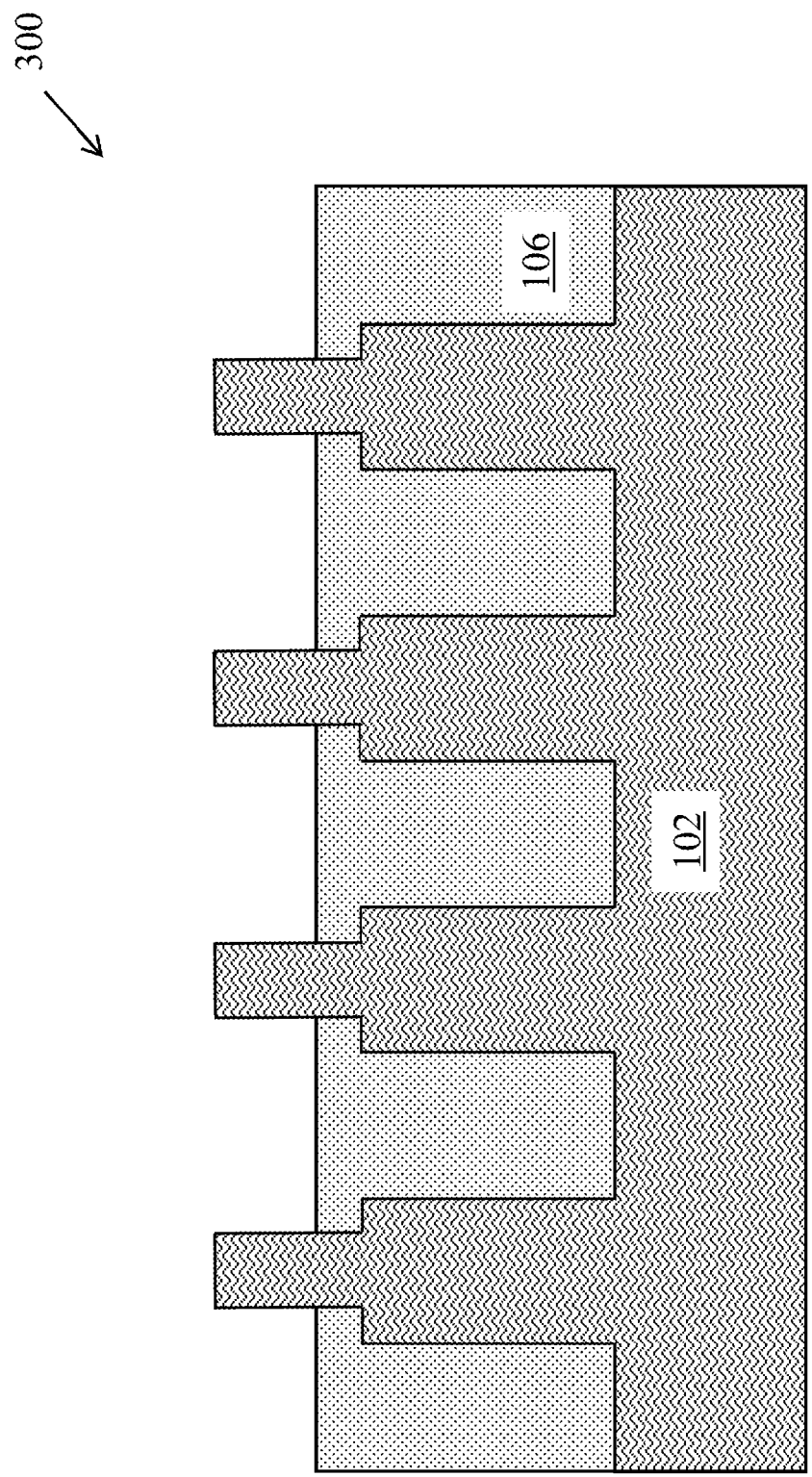

FIG. 8 illustrates the semiconductor device shown in FIG. 7A after a dielectric material has been filled in the openings between two adjacent fins in accordance with an embodiment. The openings shown in FIG. 7A are filled with dielectric materials to form the isolation region. A chemical mechanical polishing (CMP) process is then performed to remove excess portions of the dielectric material.

The formation process of the FinFET shown in FIG. 8 may include recessing isolation region 106 so that the resulting top surface of the isolation region 106 may be lower than the top surface of the upper portion of the reverse T-shaped fin. A gate region (not shown) will wrap the portion of the reverse T-shaped fin higher than the top surface of the isolation region 106 to form a FinFET.

Figure 9:
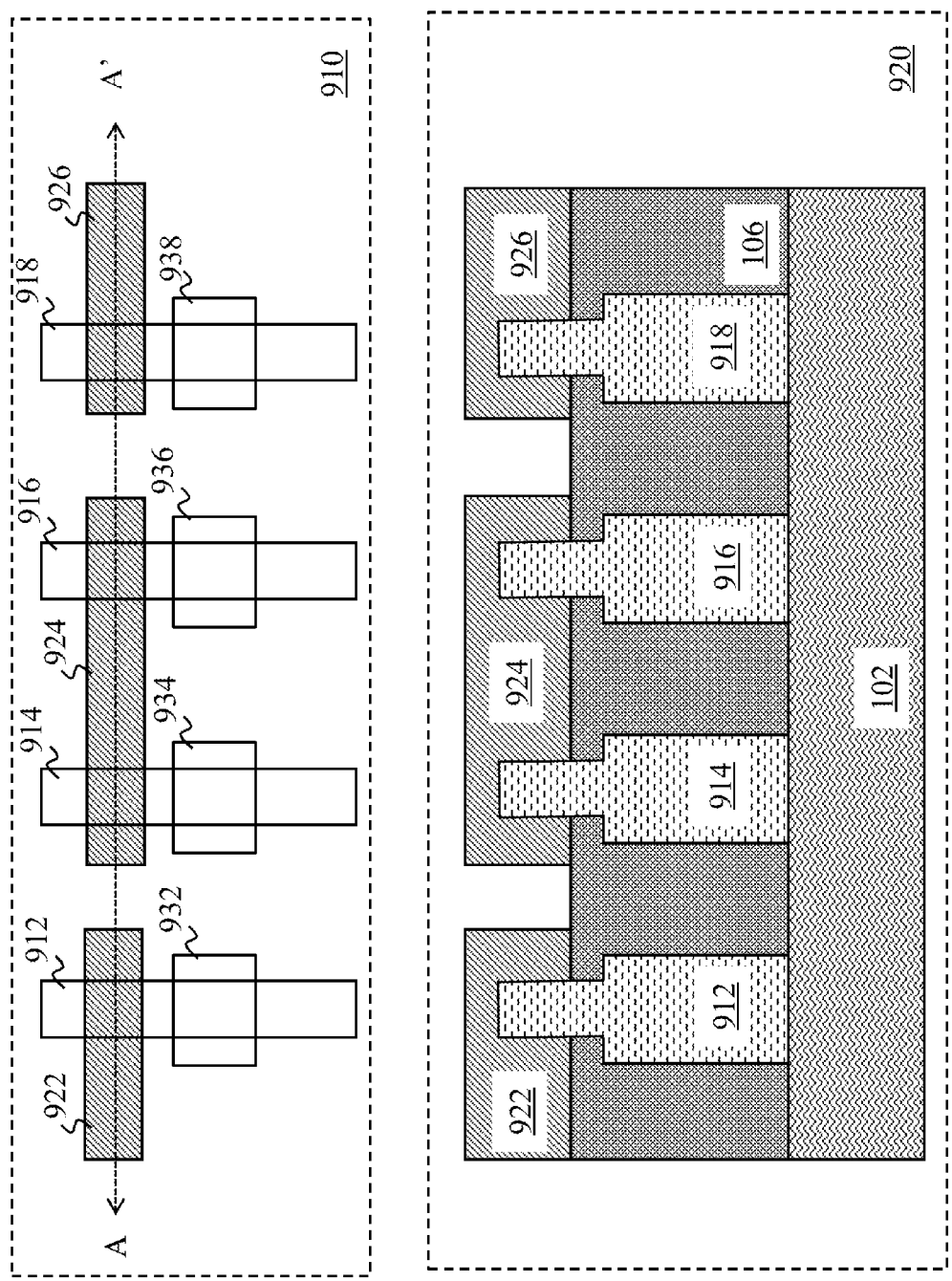
FIG. 9 illustrates a top view and a cross sectional view of a semiconductor device in accordance with an embodiment.

FIG. 9 illustrates a top view and a cross sectional view of a semiconductor device in accordance with an embodiment. The top view 910 shows the semiconductor device may comprise four fin lines 912, 914, 916 and 918, and three gate regions 922, 924 and 926. A transistor may be formed at the cross point between a fin line and a gate region. For example, there is a transistor formed at the cross point between the fin line 912 and the gate region 922. Likewise, there is another transistor formed at the cross point between the fin line 918 and the gate region 926. In addition, two transistors having their gates coupled together are formed at the cross point between the gate region 924 and the fin line 914, and the cross point between the gate region 924 and the fin line 916 respectively.

The dashed rectangle 920 includes a cross sectional view of the semiconductor device along the dashed line A-A' shown in the dashed rectangle 910. As shown in FIG. 9, the cross sectional view of each fin line (e.g., fin line 912) shows a reverse T-shaped fin structure. The upper portion of the fin protrudes over the top surface of the isolation region 106. Moreover, the gate region (e.g., gate region 922) wraps the upper portion of the fin line (e.g., fin line 912) around three sides. As a result, the gate region can better control the channel so as to reduce leakage current. Likewise, the fin line 918 has the same shape as the fin line 912. The FinFETs formed by the fin lines 914 and 916 may have their gates coupled to each other. Therefore, in the cross sectional view 920, the upper portions of the fin line 914 and the fin line 916 are wrapped by the same gate region.

Figure 10:
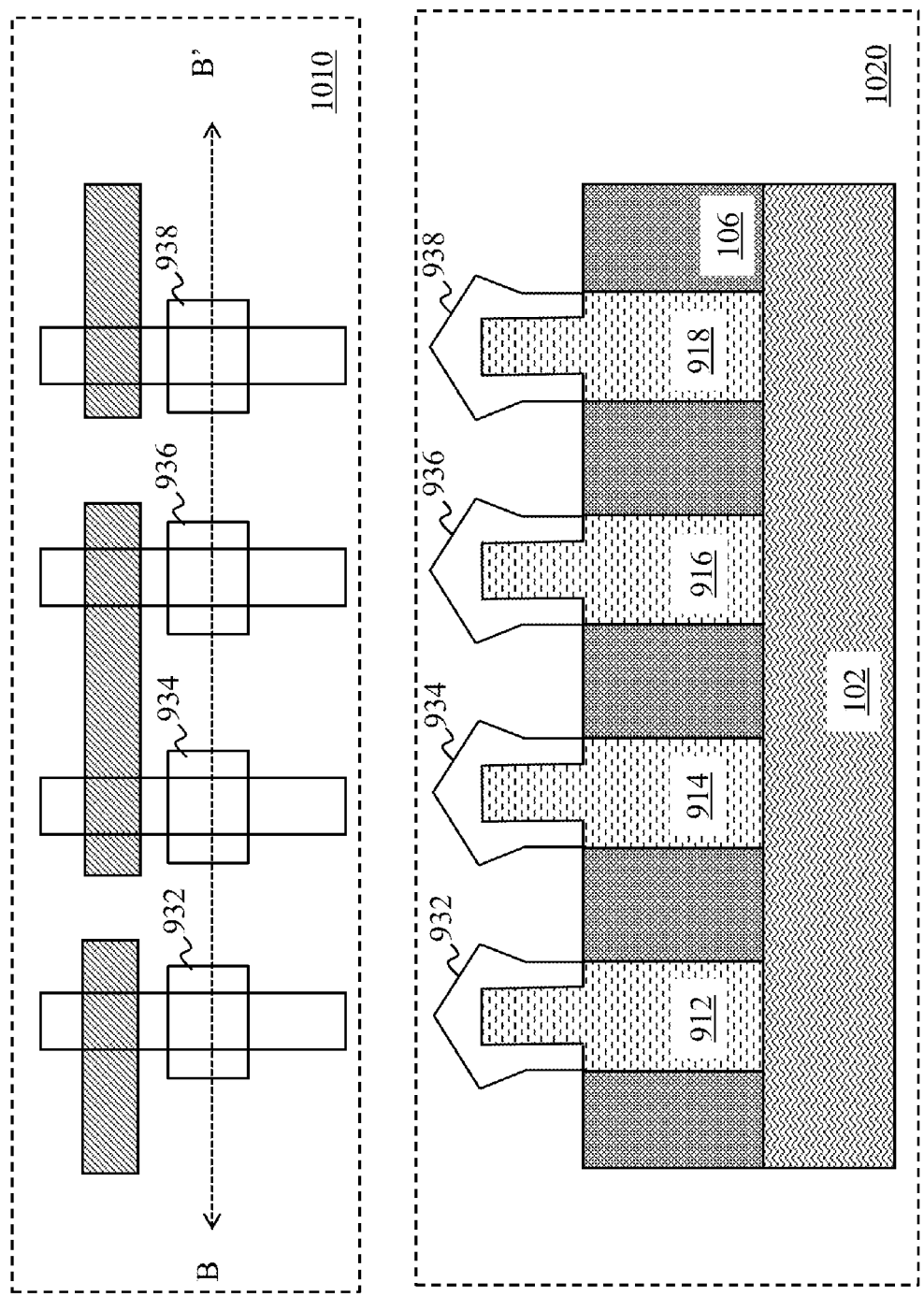
FIG. 10 illustrates a cross sectional view of drain/source regions of FinFETs having a reverse T-shaped fin in accordance with an embodiment.

FIG. 10 illustrates a cross sectional view of drain/source regions of FinFETs having a reverse T-shaped fin in accordance with an embodiment. The top view 1010 is similar to the top view 910 shown in FIG. 9, and hence is not discussed again herein. The cross section view 1020 illustrates the drain/source regions along the dashed line B-B'. The source/drain regions 932, 934, 936 and 938 may be grown through a selective epitaxial process. In accordance with an embodiment, either n-type dopants such as boron or p-type dopants such as phosphorous may be in-situ doped with the proceeding of the epitaxial growth. Alternatively, the epitaxial layer may be doped using other suitable techniques such as ion implantation, diffusion and the like.

As shown in FIG. 10, the drain/source regions (e.g., drain/source region 932) have a larger volume in comparison with the upper portion of the fin line. In particular, the height of the drain/source region is higher than the height of the upper portion of the fin line. Such a wider and higher drain/source region helps to improve the contact landing area of the drain/source region. As a result, the contact resistance may be reduced.

In addition, a different material that has a different lattice constant than the channel region may be employed to form the drain/source region (e.g., drain/source region 932). In accordance with an embodiment, the epitaxial growth profile of a p-type transistor may comprise a material selected from a group consisting of SiGe, SiGEC, Ge, Si and any combinations thereof. The epitaxial growth profile of an n-type transistor may comprise a material selected from a group consisting of Sip, SiC, SiPC, Si and any combinations thereof.

One advantageous feature of having a lattice mismatch between the drain/source and the channel region is that the lattice mismatch between the source/drain and the channel region will impart a stress into the channel region, thereby improving the carrier mobility and the overall performance of the device.

In accordance with an embodiment, after the drain/source regions have been formed, an optional silicide process can be used to form silicide contacts (not shown) along the drain/source regions. The silicide contacts may comprise nickel, cobalt, platinum, or erbium in order to reduce the Schottky barrier height of the contact. However, other commonly used metals, such as titanium, palladium, and the like, may also be used. The silicide process may be implemented by using suitable techniques. For example, the silicidation may be performed by blanket deposition of an appropriate metal layer, followed by an annealing step which causes the metal to react with the underlying exposed silicon. Un-reacted metal is then removed through a suitable technique such as a selective etching process, and a second anneal may be performed for a silicide phase adjustment. The thickness of the silicide contacts may be between about 5 nm and about 50 nm.

Figure 11:
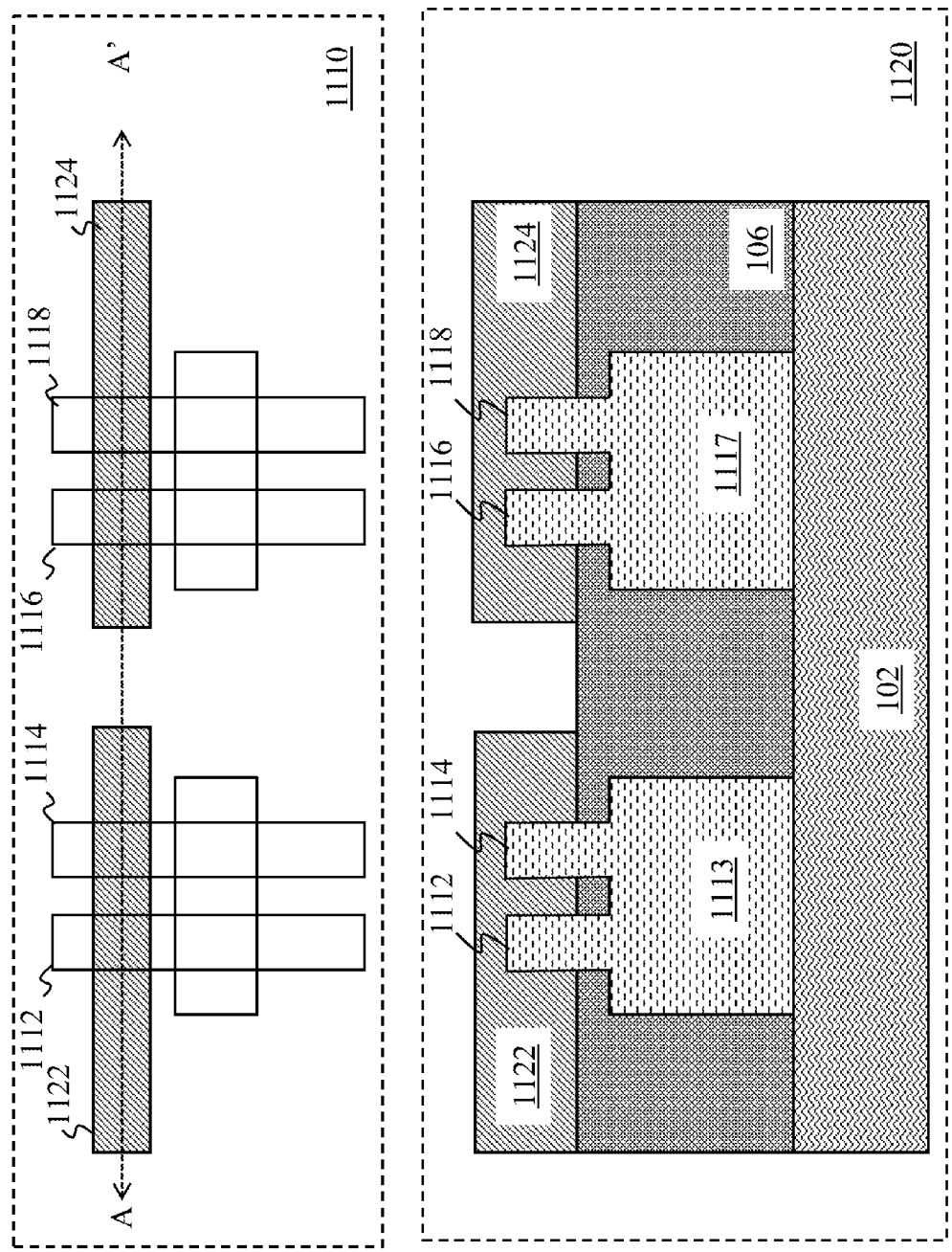
FIG. 11 illustrates a top view and a cross sectional view of channel regions of FinFETs in accordance with another embodiment.

FIG. 11 illustrates a top view and a cross sectional view of channel regions of FinFETs in accordance with another embodiment. The semiconductor device shown in FIG. 11 is similar to the semiconductor device shown in FIG. 9 except that there may be two fin lines (e.g., fin lines 1112 and 1114) formed on the second stage of the cross sectional view of the channel region. As shown in FIG. 11, the channel region is formed by two stages. The bottom stage includes a wider fin line (e.g., 1113). The upper stage includes two fin lines (e.g., fin lines 1112 and 1114). The formation process of the semiconductor device shown in FIG. 11 is similar to that of the semiconductor device 300 shown in FIG. 3, and hence is not discussed in further detail to avoid unnecessary repetition.

Figure 12:
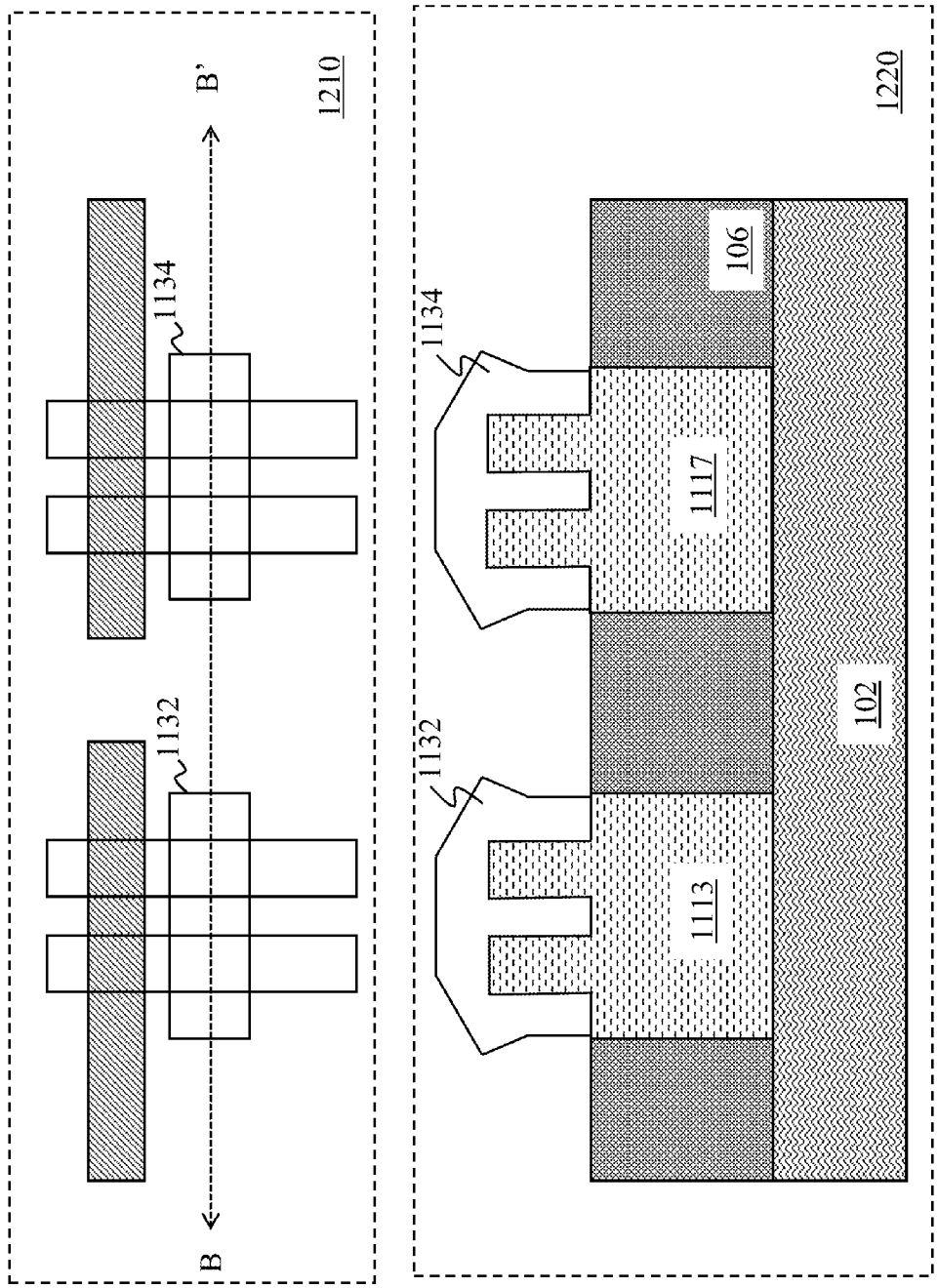
FIG. 12 illustrates a cross sectional view of drain/source regions of FinFETs having two fin lines on a second stage of the fin structure in accordance with an embodiment.

FIG. 12 illustrates a cross sectional view of drain/source regions of FinFETs having two fin lines on a second stage of the fin structure in accordance with an embodiment. The drain/source regions 1132 and 1134 may be grown through a selective epitaxial process, which has been described above with respect to FIG. 10, and hence is not discussed again to avoid repetition.

Figure 13:
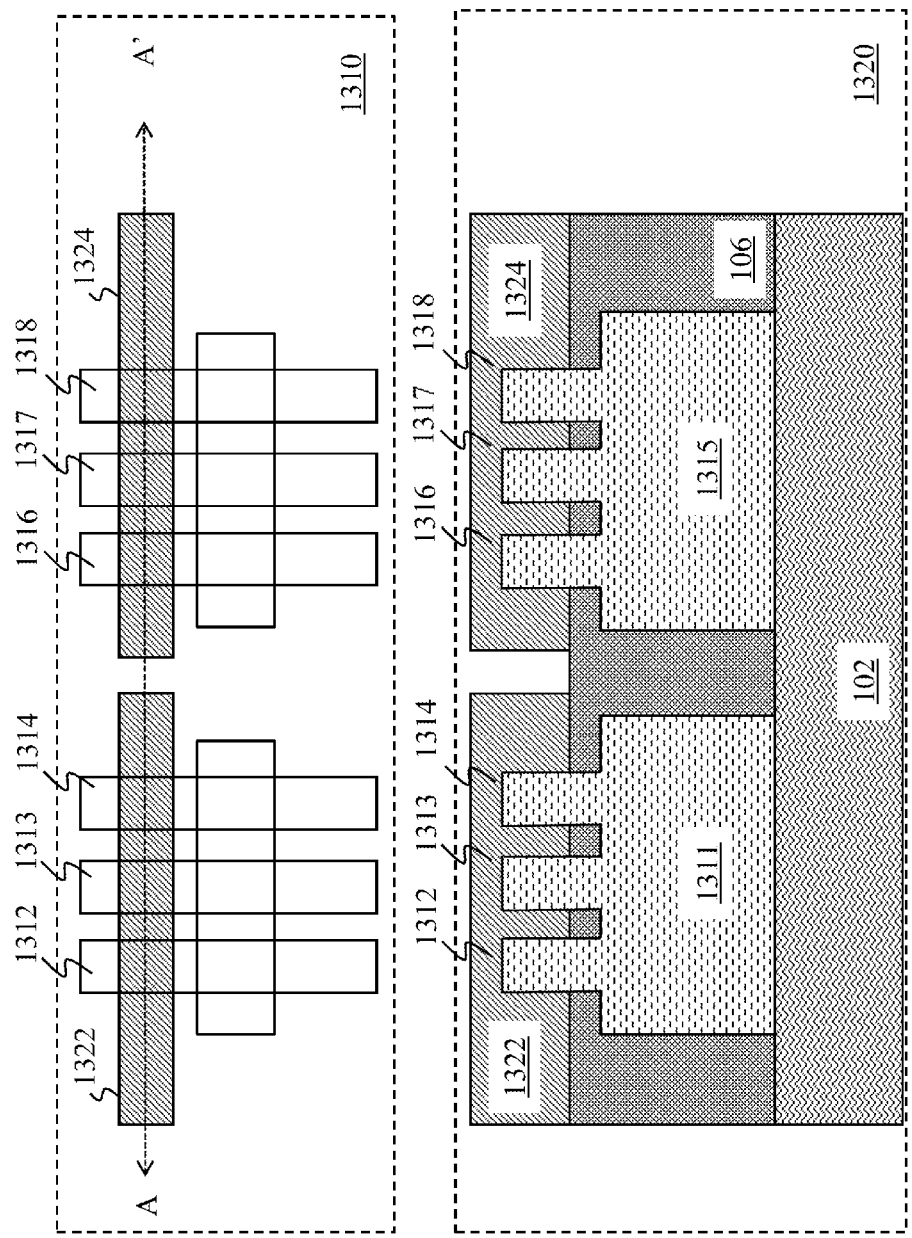
FIG. 13 illustrates a cross sectional view of channel regions of FinFETs in accordance with another embodiment.

FIG. 13 illustrates a cross sectional view of channel regions of FinFETs in accordance with another embodiment. The semiconductor device shown in FIG. 13 is similar to the semiconductor device shown in FIG. 9 except that there may be three fin lines 1312, 1313 and 1314 formed on the second stage of the cross sectional view of the channel region. As shown in FIG. 13, the channel region is formed by two stages. The bottom stage includes a wider fin structure such as fin structure 1311. The upper stage includes three fin lines (e.g., fin lines 1312, 1313 and 1314). The formation process of the semiconductor device shown in FIG. 13 is similar to that of the semiconductor device 300, and hence is not discussed in further detail to avoid unnecessary repetition.

Figure 14:
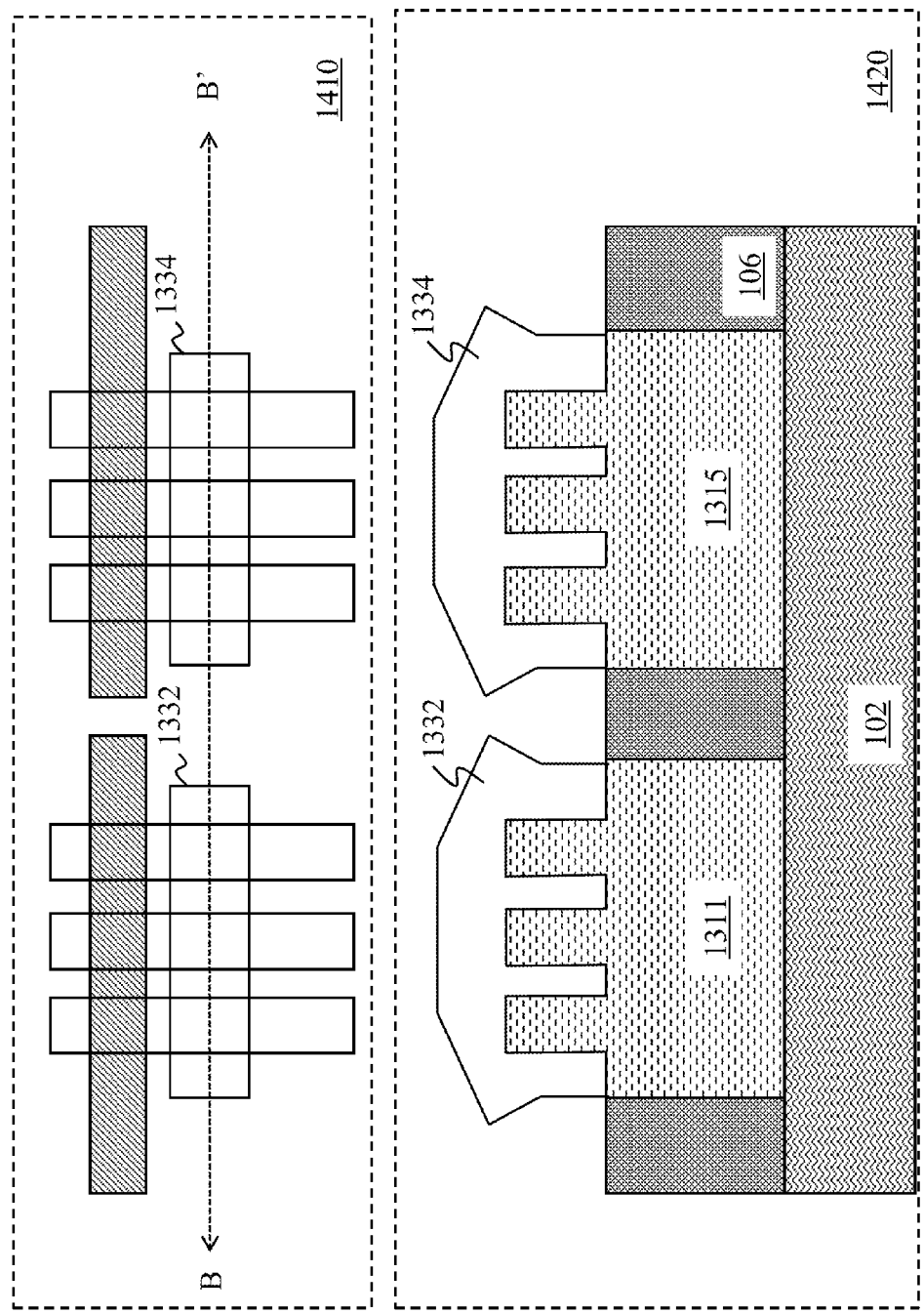
FIG. 14 illustrates a cross sectional view of the drain/source regions of the FinFETs shown in FIG. 13 in accordance with an embodiment.

FIG. 14 illustrates a cross sectional view of the drain/source regions of the FinFETs shown in FIG. 13 in accordance with an embodiment. The drain/source regions 1332 and 1334 may be grown through a selective epitaxial process, which has been described above with respect to FIG. 10, and hence is not discussed again to avoid repetition.

Figure 15:
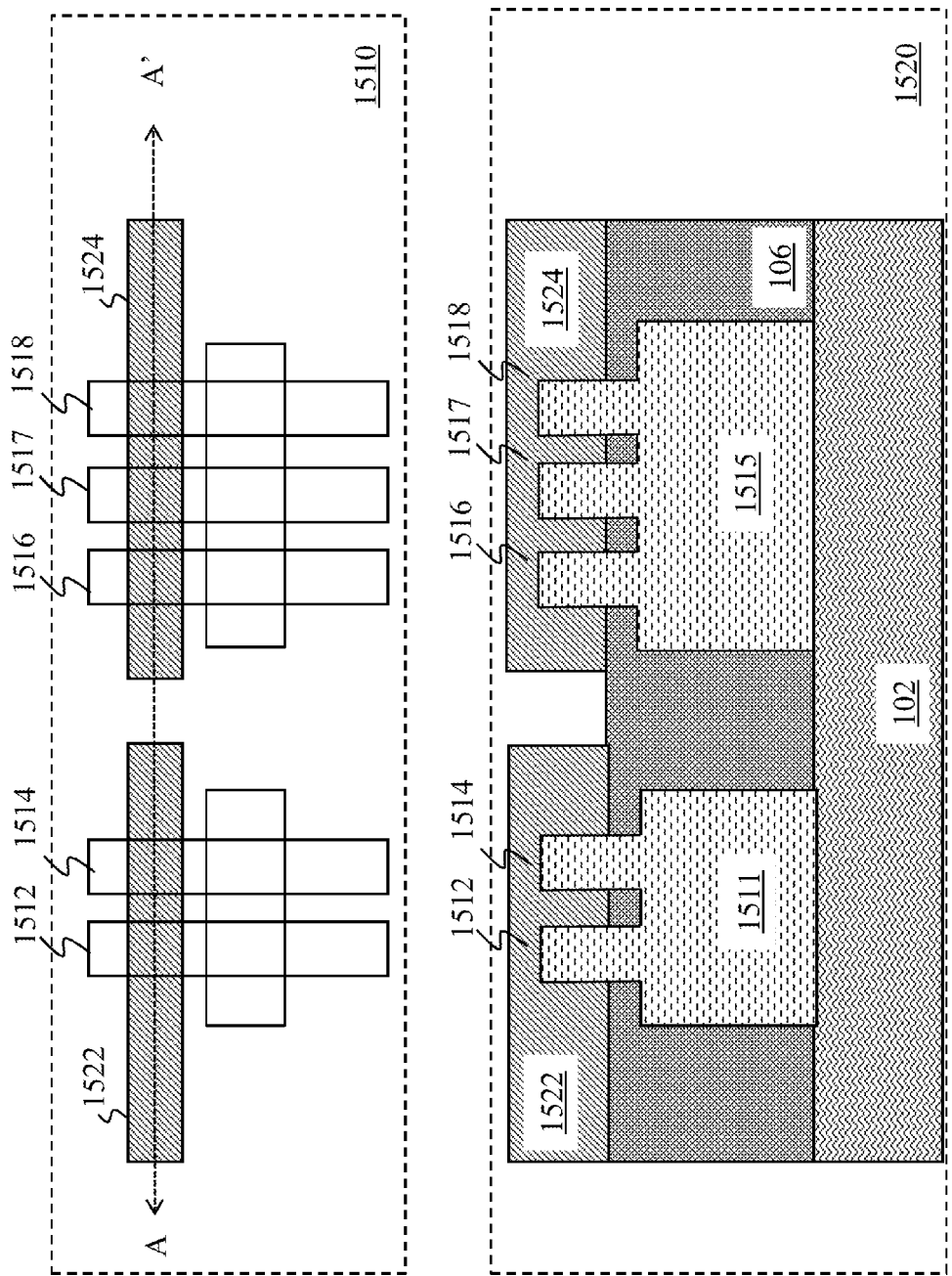
FIG. 15 illustrates a cross sectional view of channel regions of FinFETs in accordance with another embodiment.

FIG. 15 illustrates a cross sectional view of channel regions of FinFETs in accordance with another embodiment. The semiconductor device shown in FIG. 15 is similar to the semiconductor device shown in FIG. 9 except that the semiconductor device in FIG. 15 may comprise a combination of the fin structure shown in FIG. 11 and the fin structure shown in FIG. 13. As shown in FIG. 15, for the first fin structure the channel region is formed by two stages. In particular, there may be two fin lines 1512 and 1514 formed on a fin structure 1511. Fin lines 1512 and 1514 are wrapped by a gate region 1522. Likewise, the channel region of the second fin structure is formed by two stages. In particular, there may be three fin lines 1516, 1517 and 1518 formed on a fin structure 1515. Fin lines 1516, 1517 and 1518 are wrapped around three sides by a gate region 1524.

Figure 16:
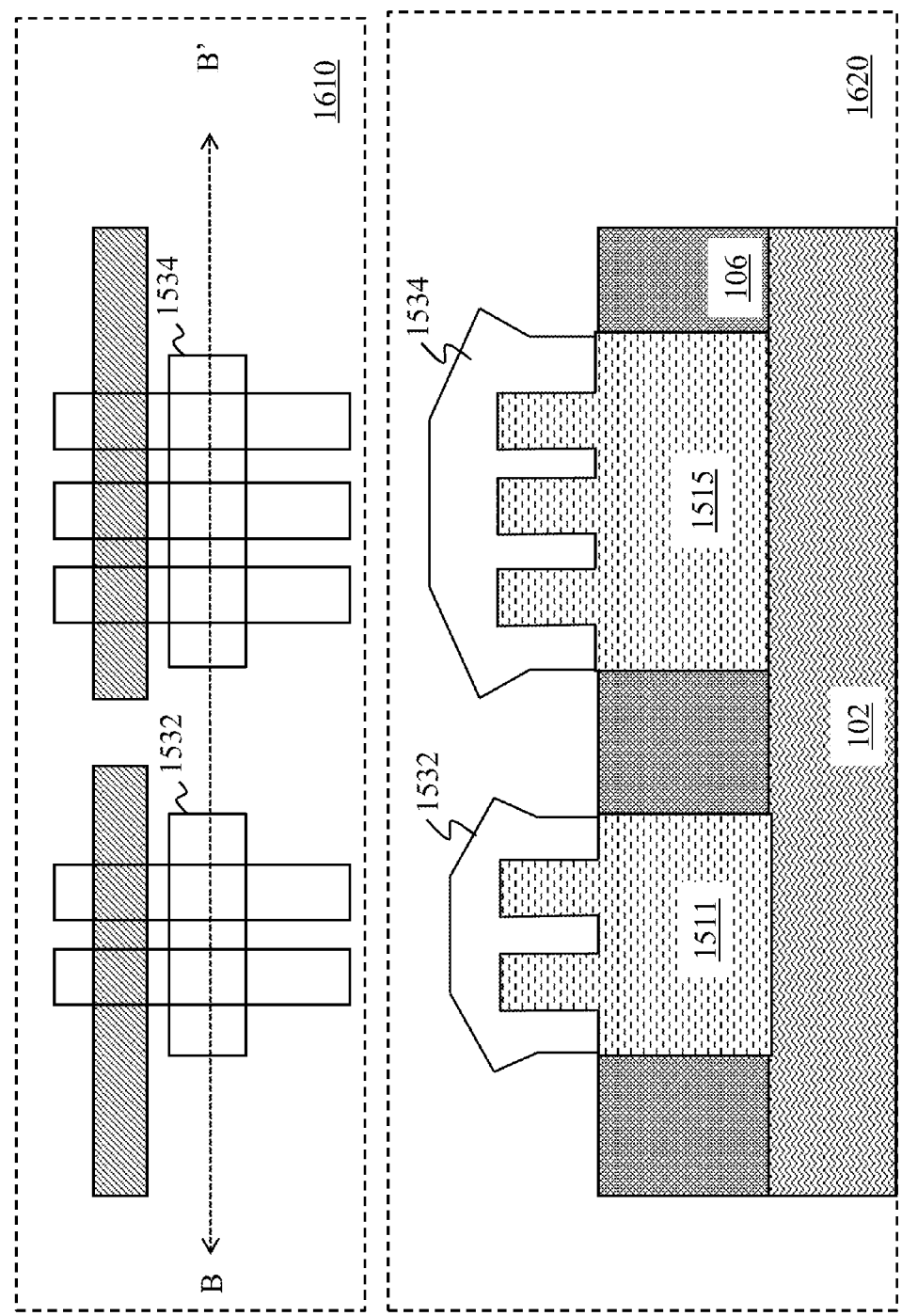
FIG. 16 illustrates a cross sectional view of the drain/source regions of the FinFETs shown in FIG. 15.

FIG. 16 illustrates a cross sectional view of the drain/source regions of the FinFETs shown in FIG. 15. The drain/source regions 1532 and 1534 may be grown through a selective epitaxial process, which has been described above with respect to FIG. 10, and hence is not discussed again to avoid repetition.

Figure 17:
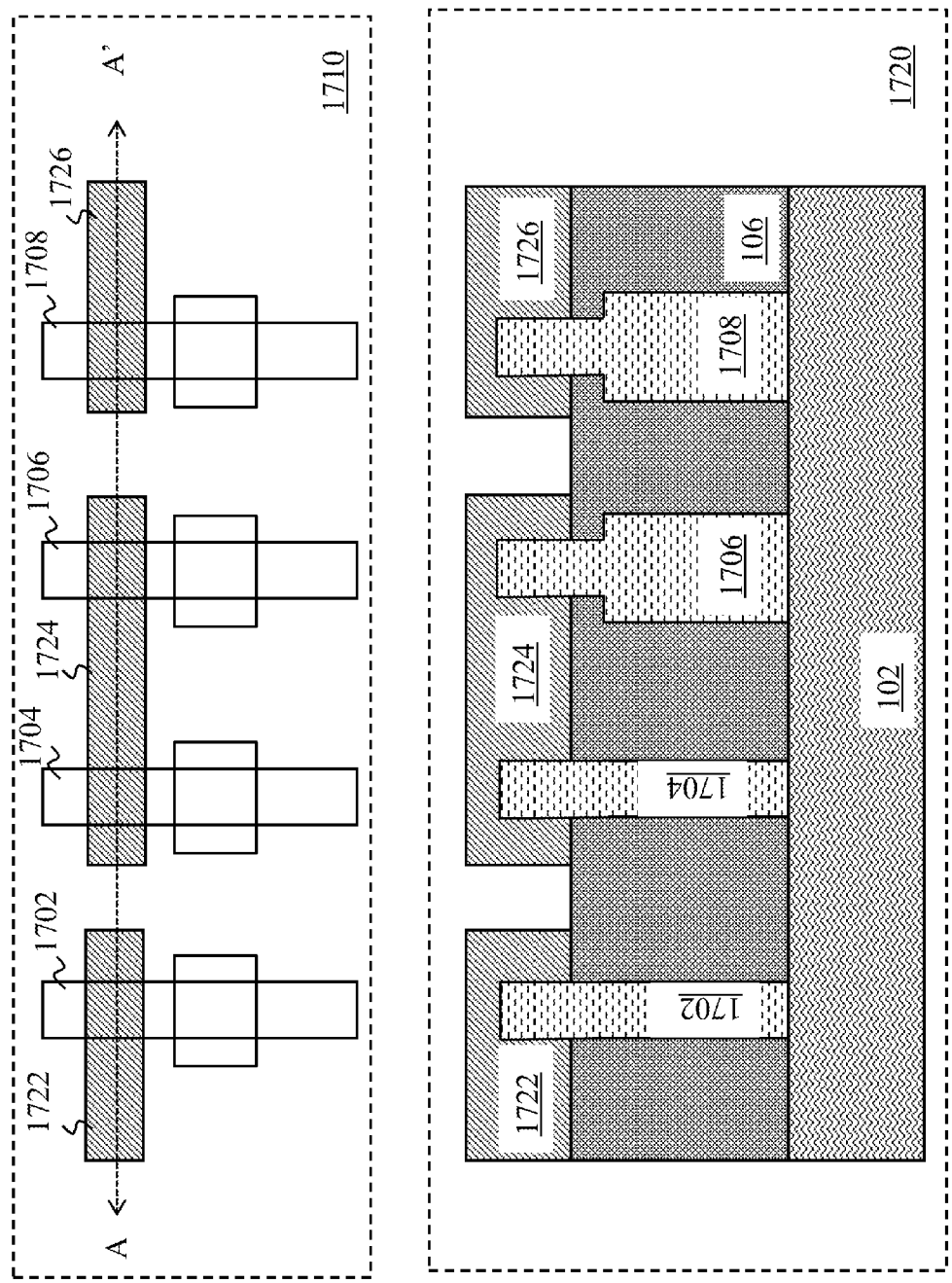
FIG. 17 illustrates a cross sectional view of channel regions of FinFETs in accordance with another embodiment.

FIG. 17 illustrates a cross sectional view of channel regions of FinFETs in accordance with another embodiment. The semiconductor device shown in FIG. 17 is similar to the semiconductor device shown in FIG. 9 except that the semiconductor device in FIG. 17 may comprise a combination of a traditional fin structure and the fin structure shown in FIG. 9. As shown in FIG. 17, the channel region of the first fin structure (e.g., fin structures 1702 and 1704) is formed by a single stage. The channel region of the second fin structure (e.g., fin structures 1706 and 1708) is formed by two stages. The second fin structure is similar to that shown in FIG. 9.

FIG. 17 further illustrates the fin line 1702 is wrapped by the gate region 1722 to form a FinFET transistor. Likewise, the fin line 1708 is wrapped by the gate region 1726 to form another FinFET transistor. Fin lines 1704 and 1706 are wrapped by the same gate region. Therefore, the FinFET transistors formed by fin lines 1704 and 1706 have their gates coupled to each other.

Figure 18:
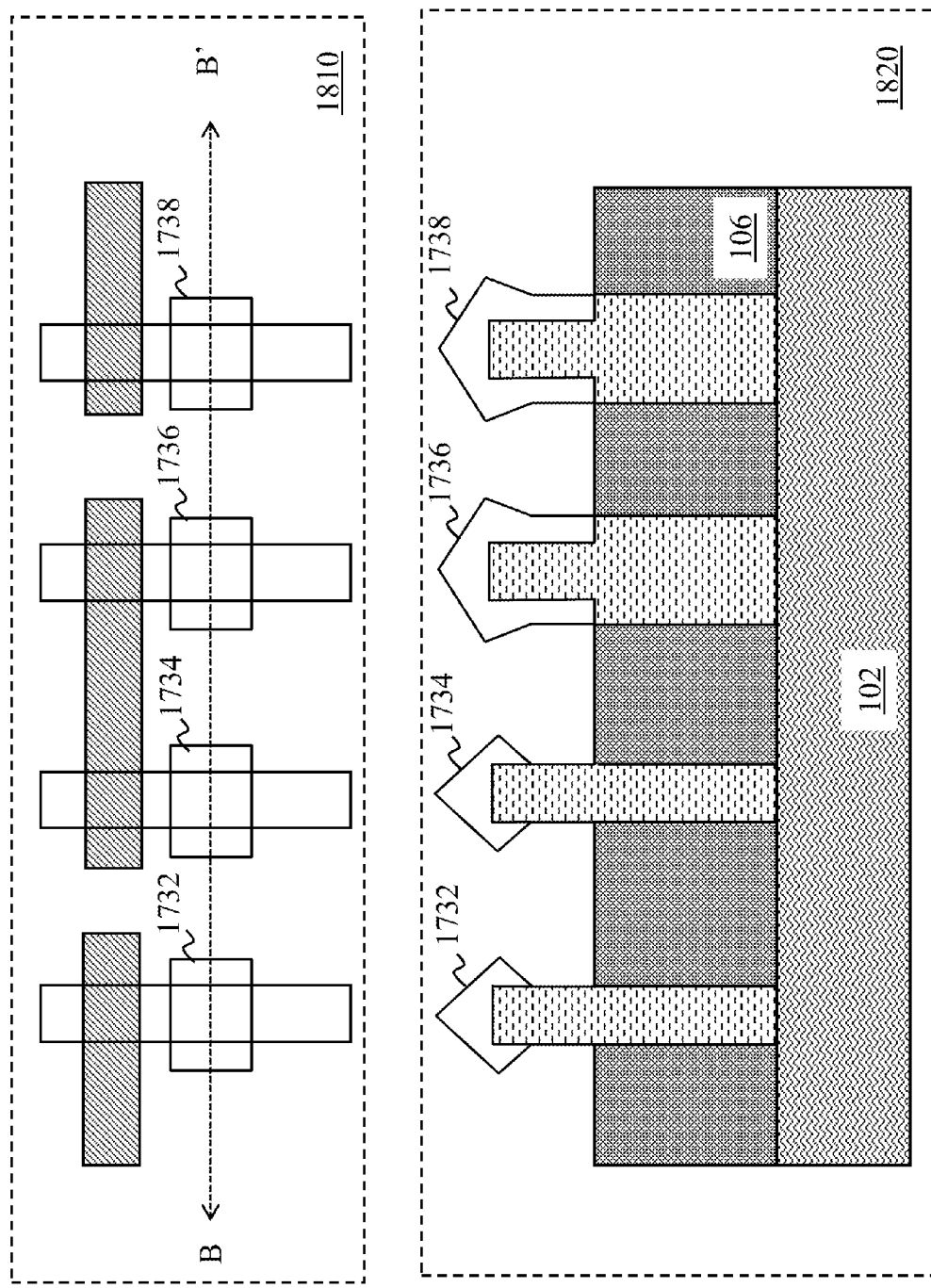
FIG. 18 illustrates a cross sectional view of the drain/source regions of the FinFETs shown in FIG. 17 in accordance with an embodiment.

It should be noted that the combination of two different fin structures in one semiconductor device shown in FIG. 17 is merely an example, which should not unduly limit the scope of the claims. One of ordinary skill in the art would recognize many variations, alternatives, and modifications. For example, a semiconductor device may comprise both the traditional fin structure and any two-stage fin structure described above. A skilled person in the art will appreciate that any combinations of different fin structures described above are fully intended to be included within the scope of the present disclosure FIG. 18 illustrates a cross sectional view of the drain/source regions of the FinFETs shown in FIG. 17 in accordance with an embodiment. The drain/source regions 1732, 1734, 1736 and 1738 may be grown through a selective epitaxial process, which has been described above with respect to FIG. 10, and hence is not discussed again to avoid unnecessary repetition.

Figure 19:
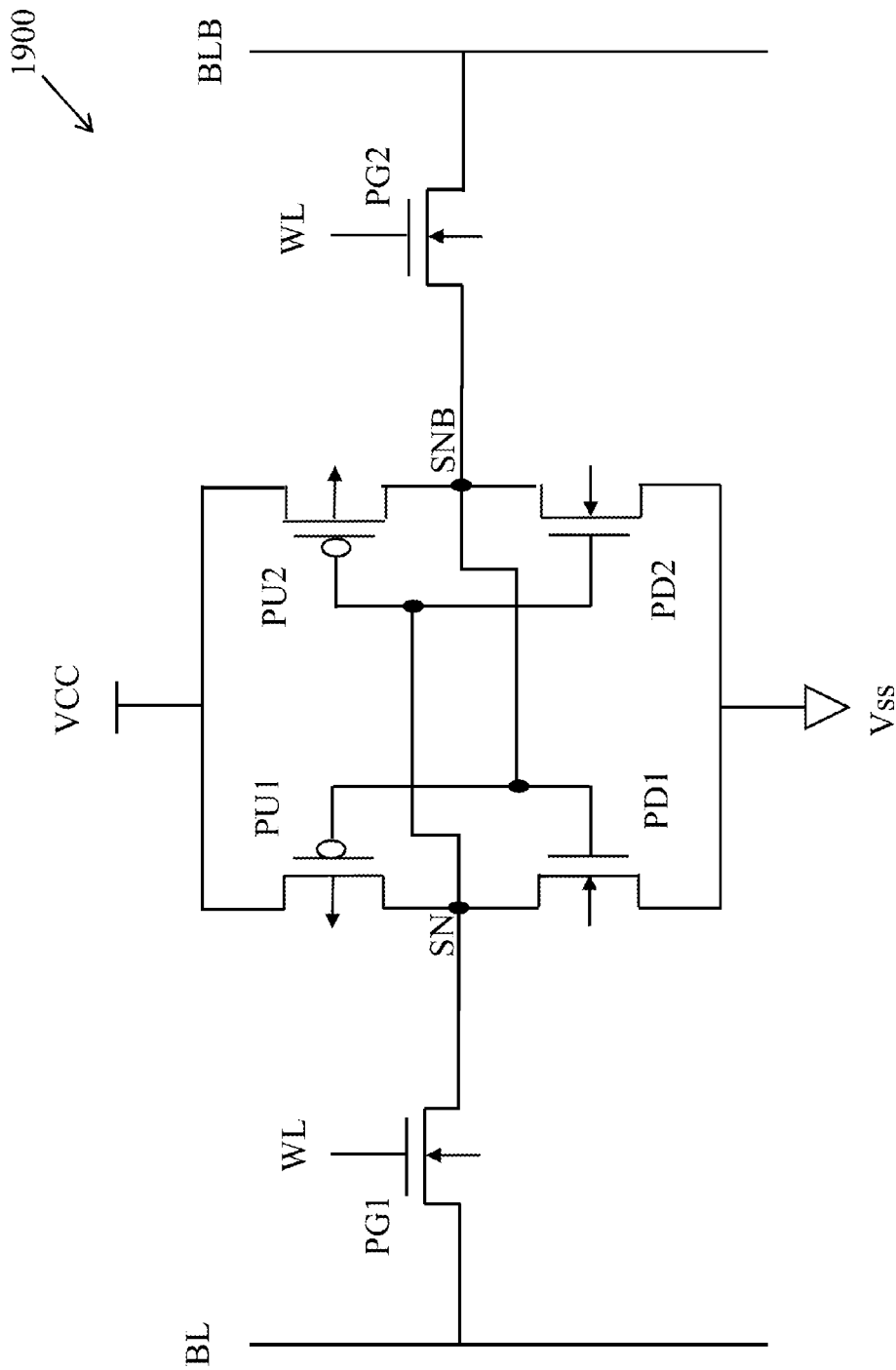
FIG. 19 illustrates a circuit diagram of a 6T SRAM cell according to an embodiment.

FIG. 19 illustrates a circuit diagram of a six transistor (6T) SRAM cell according to an embodiment. The SRAM cell 1900 comprises a first inverter formed by a pull-up p-type metal oxide semiconductor (PMOS) transistor PU1 and a pull-down n-type metal oxide semiconductor (NMOS) transistor PD1. The SRAM cell 1900 further comprises a second inverter formed by a pull-up PMOS transistor PU2 and a pull-down NMOS transistor PD2. Furthermore, both the first inverter and second inverter are coupled between a voltage bus VCC and a ground potential VSS.

As shown in FIG. 19, the first inverter and the second inverter are cross-coupled. That is, the first inverter has an input connected to the output of the second inverter. Likewise, the second inverter has an input connected to the output of the first inverter. The output of the first inverter is referred to as a storage node SN. Likewise, the output of the second inverter is referred to as a storage node SNB. In a normal operating mode, the storage node SN is in the opposite logic state as the storage node SNB. By employing the two cross-coupled inverters, the SRAM cell 1900 can hold the data using a latched structure so that the stored data will not be lost without applying a refresh cycle.

In an SRAM array (not shown) using the 6T SRAM cells, the cells are arranged in rows and columns. The columns of the SRAM array are formed by a bit line pairs, namely a first bit line BL and a second bit line BLB. In addition, the cells of the SRAM array are disposed between the respective bit line pairs. As shown in FIG. 19, the SRAM cell 1900 is placed between the bit line BL and the bit line BLB.

As shown in FIG. 19, the SRAM cell 1900 further comprises a first pass-gate transistor PG1 connected between the bit line BL and the output of the first inverter. The SRAM cell 1900 further comprises a second pass-gate transistor PG2 connected between the bit line BLB and the output of the second inverter. The gates of the first pass-gate transistor PG1 and the second pass-gate transistor PG2 are connected to a word line (WL).

As shown in the circuit diagram of FIG. 19, transistors PU1, PU2 are p-type transistors. Transistors PU1 and PU2 can be implemented by a variety of p-type transistors such as planar p-type field effect transistors (PFETs), p-type fin field effect transistors (FinFETs) or the like. Transistors PD1, PD2, PG1, and PG2 are n-type transistors. Transistors PD1, PD2, PG1 and PG2 can be implemented by a variety of n-type transistors such as planar n-type field effect transistors (NFETs), n-type FinFETs or the like.

In operation, if the pass-gate transistors PG1 and PG2 are inactive, the SRAM cell 1900 will maintain the complementary values at storage nodes SN and SNB indefinitely. This is so because each inverter of the pair of cross coupled inverters drives the input of the other, thereby maintaining the voltages at the storage nodes. This situation will remain stable until the power is removed from the SRAM, or, a write cycle is performed changing the stored data at the storage nodes.

During a WRITE operation, bit lines BL and BLB are set to opposite logic values according to the new data that will be written into the SRAM cell 1900. For example, in an SRAM write operation, a logic state "1" stored in a data latch of the SRAM cell 1900 can be reset by setting BL to "0" and BLB to "1". In response to a binary code from a row decoder (not shown), a word line coupled to the pass-gate transistors of the SRAM cell 1900 is asserted so that the data latch is selected to proceed to a WRITE operation.

After the SRAM cell 1900 is selected, both the first pass-gate transistor PG1 and the second pass-gate transistor PG2 are turned on. As a result, the storage nodes SN and SNB are connected to BL and BLB respectively. Furthermore, the storage node SN of the data latch is discharged by BL to "0" and the other storage node of the data latch is charged by BLB to "1". As a result, the new data logic "0" is latched into the SRAM cell 1900.

In a READ operation, both BL and BLB of the SRAM cell 1900 are pre-charged to a voltage approximately equal to the operating voltage of the memory bank in which the SRAM cell 1900 is located. In response to a binary code from the row decoder, a word line coupled to the first pass-gate PG1 and the second pass-gate PG2 of the SRAM cell 1900 is asserted so that the data latch is selected to proceed to a READ operation.

During a READ operation, through a turned on pass-gate transistors PG1 and PG2, one bit line coupled to the storage node storing a logic "0" is discharged to a lower voltage. Meanwhile, the other bit line remains the pre-charged voltage because there is no discharging path between the other bit line and the storage node storing a logic "1". The differential voltage between BL and BLB (approximately in a range from 50 to 100 mV) is detected by a sense amplifier (not shown). Furthermore, the sense amplifier amplifies the differential voltage and reports the logic state of the memory cell via a data buffer.

Figure 20:
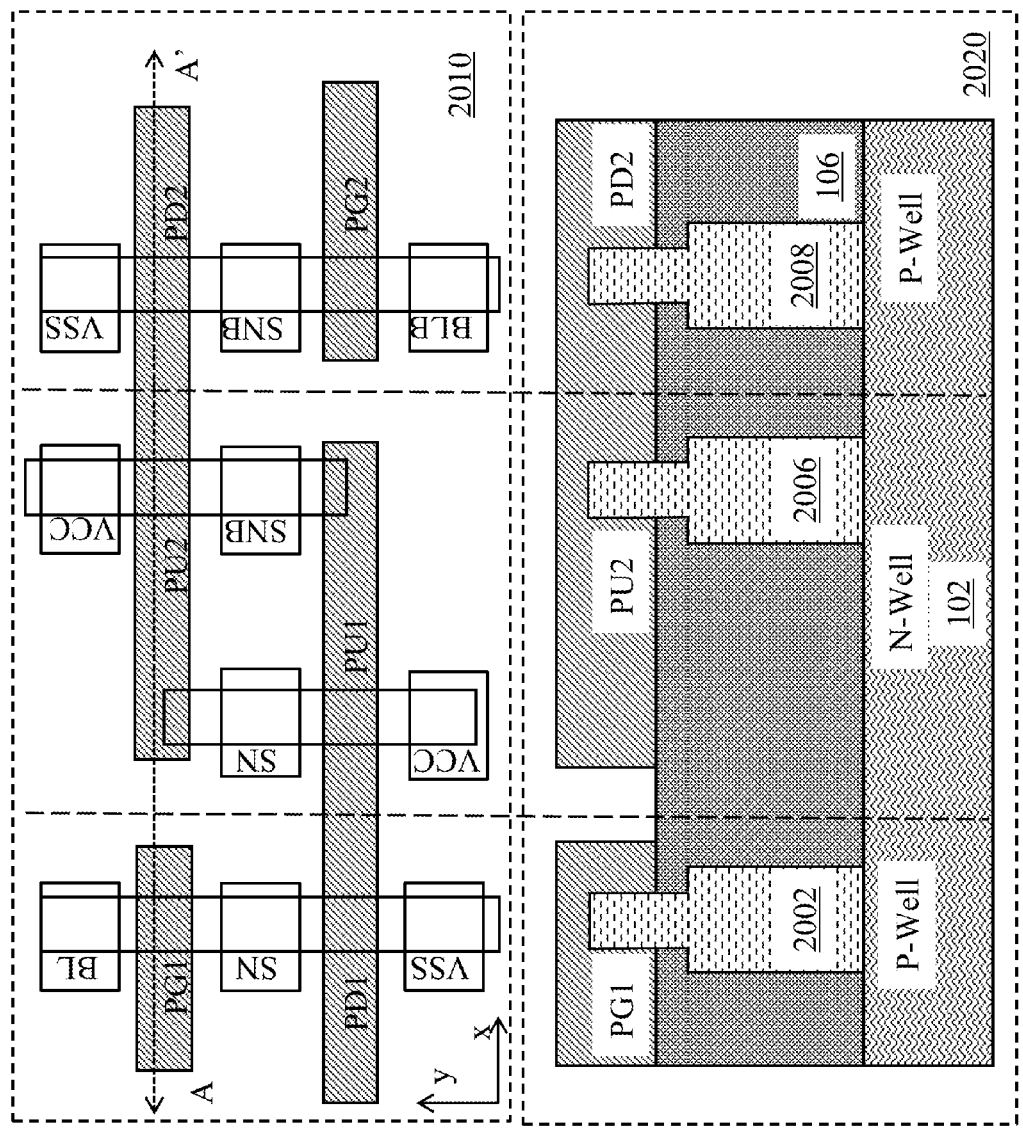
FIG. 20 illustrates a layout diagram for the SRAM cell in FIG. 19 in accordance with an embodiment.

FIG. 20 illustrates a layout diagram for the SRAM cell in FIG. 19 in accordance with an embodiment. The SRAM cell is formed by four fin lines and four gate regions. The four fin lines shown in FIG. 20 are placed in parallel. In addition, the fin lines are orthogonal to the gate regions in the layout diagram. A transistor is formed at a cross point of a fin line and a gate region. As shown in FIG. 20, the six transistors of the SRAM cell are formed at different cross points.

Two vertical dashed lines that intersect the SRAM cell indicate boundaries between a p-type well in the substrate and an n-type well in the substrate in which respective fin lines are formed. As person having ordinary skill in the art will readily understand that a drain/source region of a transistor is generally doped an opposite dopant type from the dopant type of the well in which the drain/source region is formed. For example, a source/drain region is generally p-type doped when the well in which the active area is formed is an n-type well.

As shown in FIG. 20, the active areas of transistors PG1 and PD1 is formed in a p-type well. As a result, these transistors are n-type transistors. The active areas of transistors PU1 and PU2 are formed in an n-type well. As a result, these transistors are p-type transistors. The active areas of transistors PD2 and PG2 are formed in a p-type well. Similarly, these transistors are n-type transistors.

As shown in FIG. 20, a single gate region is used as the gates of transistors PD1 and PU1. Another single gate region is used as the gates of transistors PD2 and PU2. In this manner, each single gate region electrically couples the gates of the respective two transistors. In FIG. 20, a single gate region is dedicated to the pass-gate transistor PG1. Another single gate region is dedicated to the pass-gate transistor PG2. However, a person skilled in the art should recognize that the single gate region dedicated to the pass-gate transistor PG1 may extend beyond a cell boundary so that the gate region can be shared by an adjacent SRAM cell, as does the gate region for the pass-gate transistor PG2.

Various contacts are employed to couple components in the SRAM cell. A word line contact WL (not shown) may be coupled to the gate of pass-gate transistor PG1, and another word line contact WL (not shown) is coupled to the gate of pass-gate transistor PG2. A bit line contact BL is coupled to the drain of pass-gate transistor PG1, and a complementary bit line contact BLB is coupled to the drain of pass-gate transistor PG2.

A power source contact VCC is coupled to the source of the pull-up transistor PU1, and another power source contact VCC is coupled to the source of the pull-up transistor PU2. A ground contact VSS is coupled to the source of the pull-down transistor PD1, and another ground contact VSS is coupled to the source of the pull-down transistor PD2. A storage node contact SN couples together the source of transistor PG1 and the drains of transistors PD1 and PU1. Another storage node contact SNB couples together the source of transistor PG2, and the drains of transistors PD2 and PU2.

FIG. 20 further illustrates a cross sectional view of the SRAM cell in accordance with an embodiment. The dashed rectangle 2020 includes a cross sectional view of the SRAM cell along the dashed line A-A' shown in the dashed rectangle 2010. As shown in FIG. 20, the cross sectional view of each fin line (e.g., fin 2002) shows a reverse T-shaped fin.

The upper portion of the fin protrudes over the top surface of the isolation region 106. Moreover, the gate regions (e.g., PG1) wrap the upper portion of the fin around three sides. As a result, the gate structure can better control the channel so as to reduce leakage current.

The fins 2006 and 2008 have the same shape as the fin 2002. Referring back to FIG. 19, the gate of transistor PU2 is coupled to the gate of the transistor PD2. Therefore, in the cross sectional view 2020, the upper portions of the fin 2006 and the fin 2008 are wrapped by the same gate region.

Figure 21:
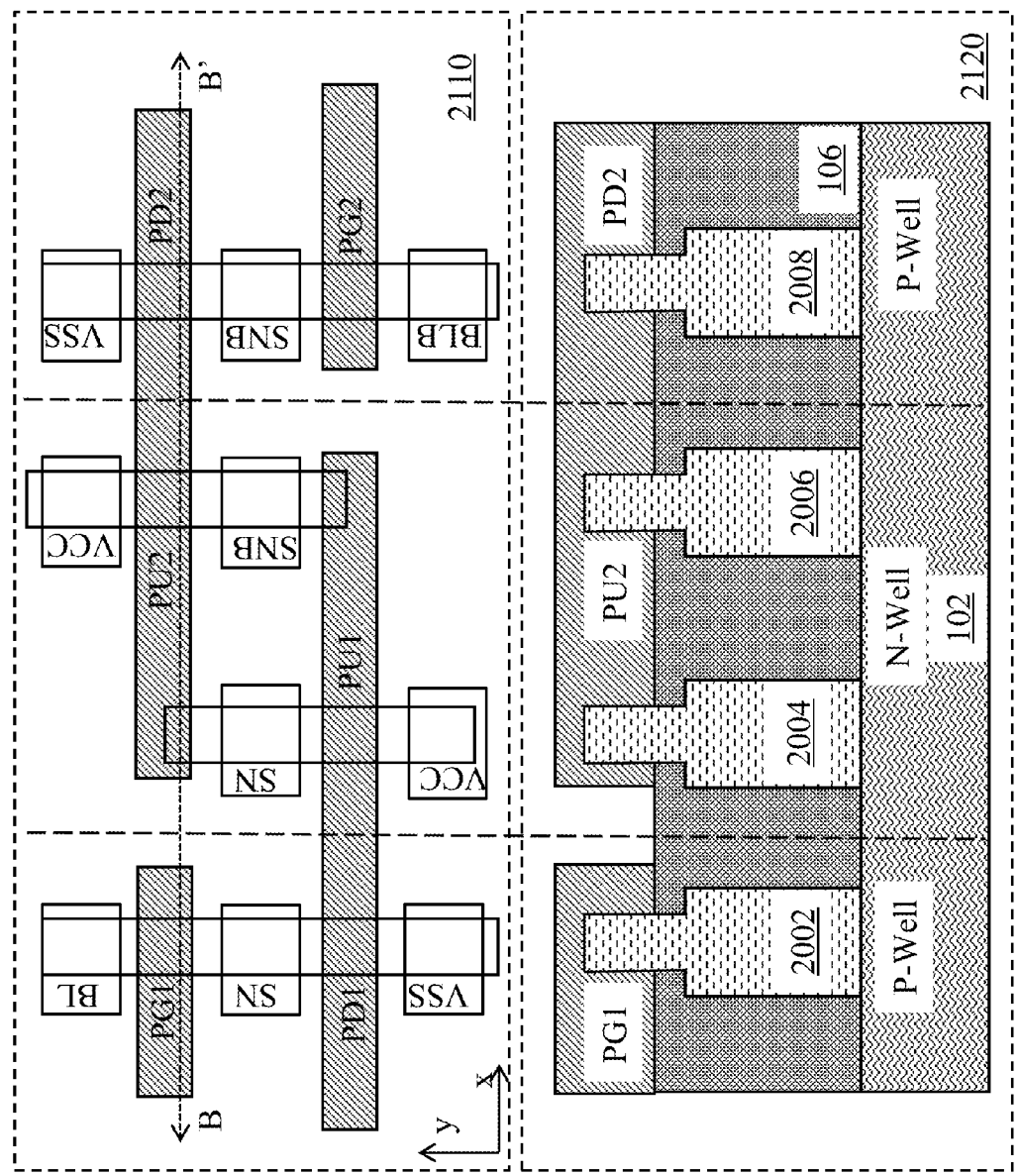
FIG. 21 illustrates another cross sectional view of the SRAM cell in accordance with an embodiment.

FIG. 21 illustrates another cross sectional view of the SRAM cell in accordance with an embodiment. The dashed rectangle 2120 includes a cross sectional view of the SRAM cell along the dashed line B-B' shown in the dashed rectangle 2110. As shown in FIG. 21, the cross sectional view of each fin (e.g., fin 2002) shows a reverse T-shaped fin. The upper portion of the fin protrudes over the top surface of the isolation region 106. Moreover, the gate regions (e.g., PG1) wrap the upper portion of the fin around three sides. As a result, the gate structure can better control the channel so as to reduce leakage current. Likewise, the fins 2004, 2006 and 2008 have the same shape as the fin 2002. Referring back to FIG. 19, the drain of transistor PU1 is coupled to the gates of the transistor PU2 and the transistor PD2. Therefore, in the cross sectional view, the drain of the fin 2004 is electrically coupled to the gate regions of the fin 2006 and the fin 2008.

Figure 22:
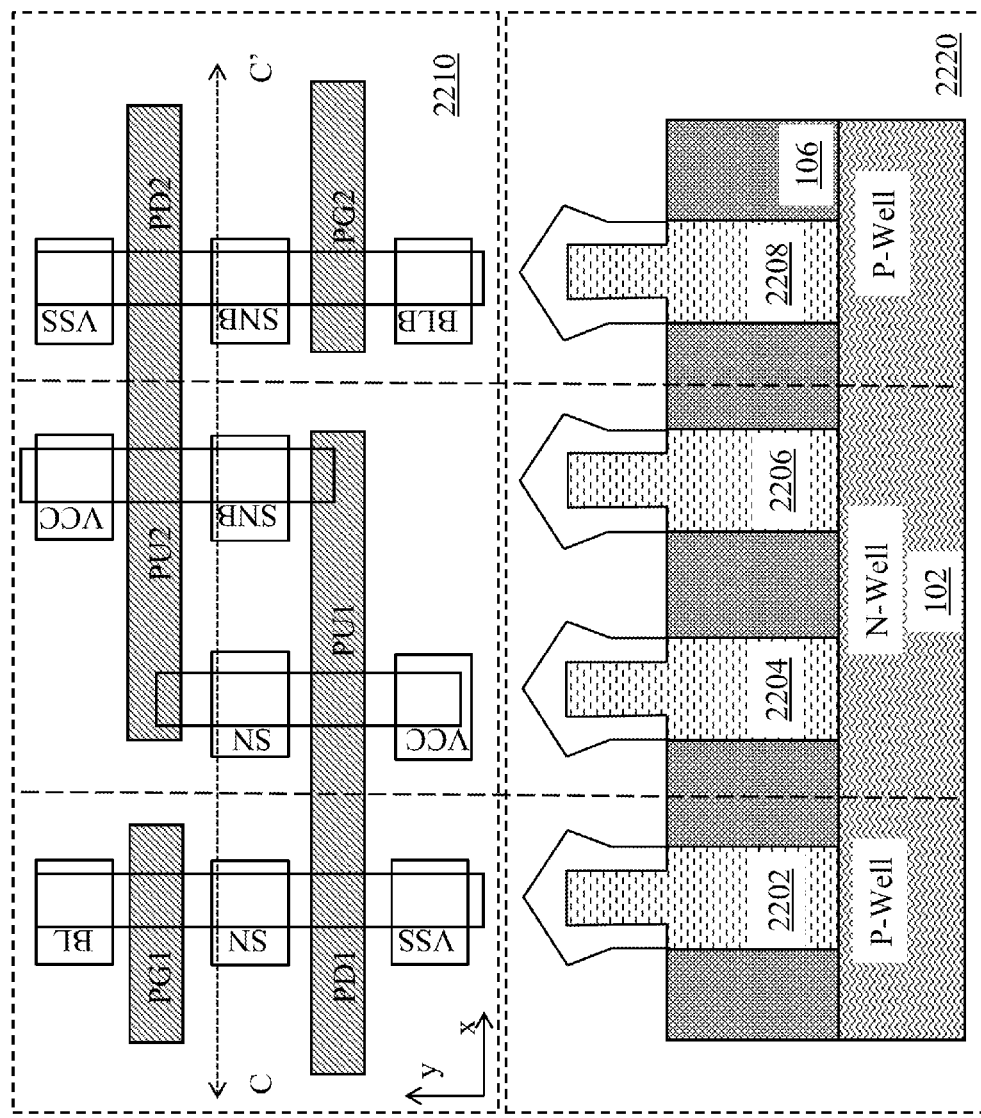
FIG. 22 illustrates a cross sectional view of drain/source regions of an SRAM cell in accordance with an embodiment.

FIG. 22 illustrates a cross sectional view of drain/source regions of the SRAM cell in FIG. 19 in accordance with an embodiment. The dashed rectangle 2220 includes a cross sectional view of the SRAM cell along the dashed line C-C' shown in the dashed rectangle 2210. As shown in FIG. 22, the source/drain regions have a larger volume in comparison with their corresponding channel regions.

Figure 23:
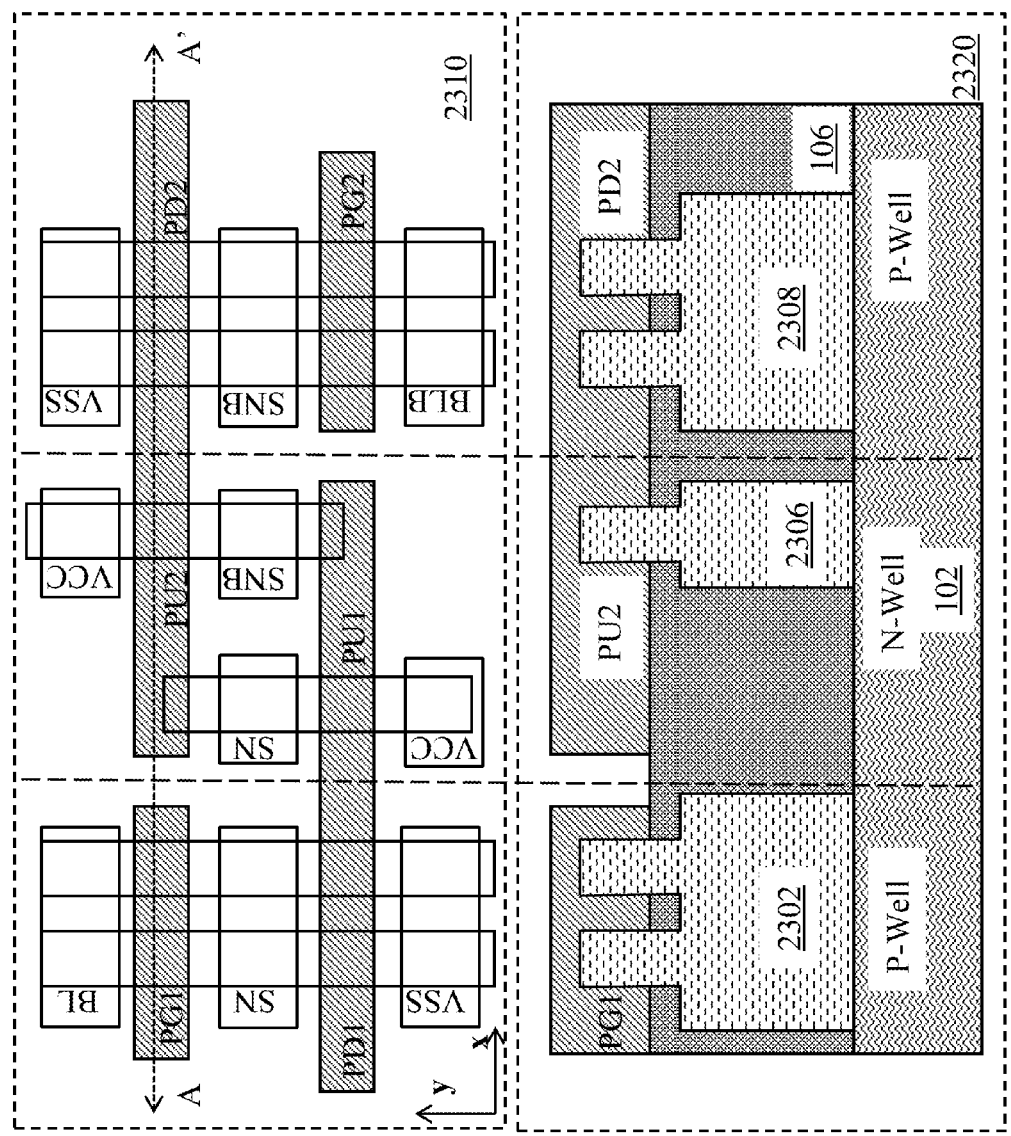
FIG. 23 illustrates a top view and a cross sectional view of an SRAM cell in accordance with another embodiment.

FIG. 23 illustrates a top view and a cross sectional view of an SRAM cell in accordance with another embodiment. The top view 2310 shows the SRAM cell in FIG. 23 is similar to the SRAM cell shown in FIG. 20 except that the NMOS transistors such as PD1, PD2, PG1 and PG2 are formed by a fin structure shown in detail in FIG. 11. The NMOS transistors may be formed by two fin lines. In other words, each NMOS transistor shown in FIG. 23 may be formed by two FinFETs connected in parallel. The PMOS transistors are formed by a single fin line.

The cross sectional view 2320 shows the SRAM cell includes a combination of two different fin structures. In particular, the PMOS PU2 is formed by a first fin structure (e.g., fin structure 2306), which has been described in detail with respect to FIG. 1. The NMOS including PD2 and PG1 are formed by a second fin structure (e.g., fin structures 2302 and 2308), which has been described in detail with respect to FIG. 11.

Figure 24:
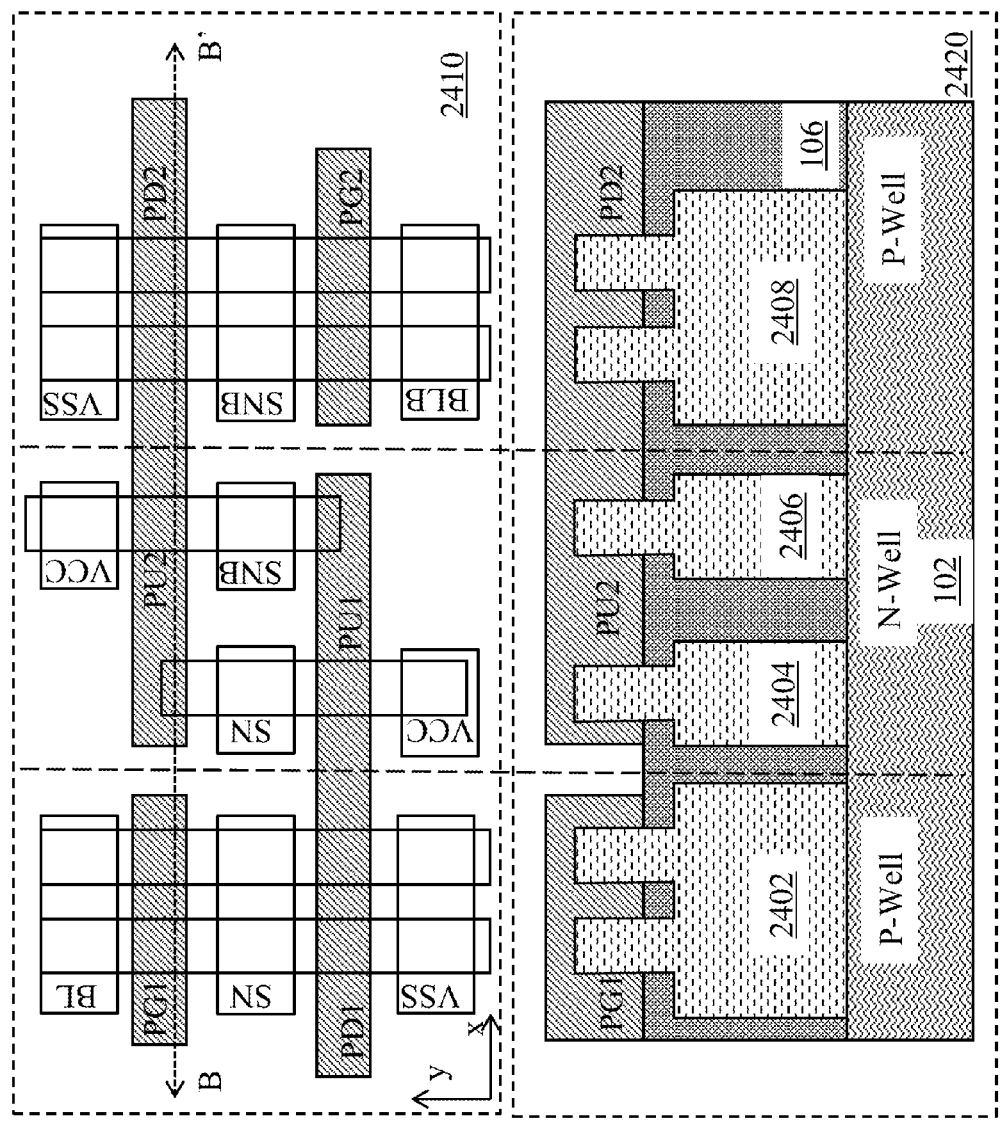
FIG. 24 illustrates another cross sectional view of the SRAM cell in accordance with an embodiment.

FIG. 24 illustrates another cross sectional view of the SRAM cell in accordance with an embodiment. As shown in FIG. 24, the PMOS transistors PU1 and PU2 are formed by a first fin structure, which has been described in detail with respect to FIG. 1. The NMOS transistor PD2 and PG1 are formed by a second fin structure, which has been described in detail with respect to FIG. 11.

The dashed rectangle 2420 includes a cross sectional view of the SRAM cell along the dashed line B-B' shown in the dashed rectangle 2410. As shown in FIG. 24, the drain of the fin 2004, the gate of the fin 2406 and the gate of the fin 2408 are wrapped by the same gate region. As a result, the drain of the fin 2004 is electrically coupled to the gate regions of the fin 2006 and the fin 2008.

Figure 25:
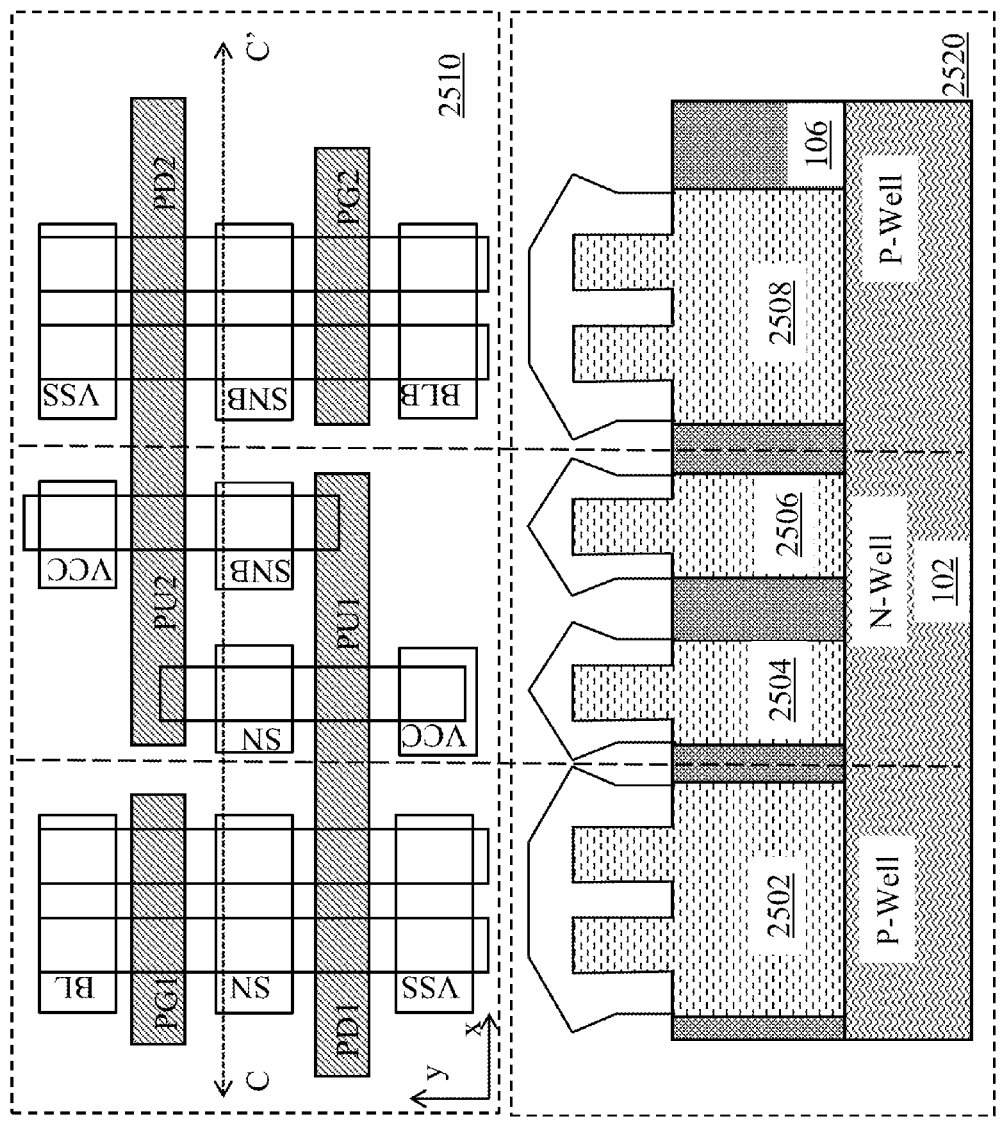
FIG. 25 illustrates a cross sectional view of drain/source regions of an SRAM cell in accordance with an embodiment.

FIG. 25 illustrates a cross sectional view of drain/source regions of an SRAM cell in accordance with an embodiment. The dashed rectangle 2520 includes a cross sectional view of the SRAM cell along the dashed line C-C' shown in the dashed rectangle 2510. As shown in FIG. 25, the source/drain regions have a larger volume in comparison with their corresponding channel regions.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a first inverter comprising a first p-type pull-up transistor (PU) and a first n-type pull-down transistor (PD);
   a second inverter cross-coupled to the first inverter comprising a second PU and a second PD;
   a first pass-gate transistor coupled between the first inverter and a first bit line; and
   a second pass-gate transistor coupled between the second inverter and a second bit line, wherein the second pass-gate transistor has a two-stage fin structure comprising multiple fin lines, and wherein a width of a bottom portion of the two-stage fin structure is greater than a width of an upper portion of the two-stage fin structure, and wherein the second pass-gate transistor comprises a merged drain/source region covering the multiple fin lines, and wherein the second PU comprises a drain/source region covering a single fin line immediately adjacent to the multiple fin lines, and wherein a doping concentration of an upper region of the bottom portion of the two-stage fin structure is higher than a doping concentration of an upper region of the upper portion of the two-stage fin structure.

2. The device of claim 1, wherein:
   the first PU is connected in series with the first PD; and
   the second PU is connected in series with the second PD.

3. The device of claim 1, wherein:
   the number of fin lines in the upper portion of the two-stage fin structure is greater than the number of fin lines in the bottom portion of the two-stage fin structure.

4. The device of claim 1, wherein:
   the bottom portion and the upper portion of the two-stage fin structure are trapezoidal in shape.

5. The device of claim 1, wherein:
   the upper portion of the two-stage fin structure comprises two fin lines over the bottom portion of the two-stage fin structure.

6. The device of claim 1, wherein:
the first PU comprises a first two-stage fin structure, and wherein an upper portion of the first two-stage fin structure comprises a single fin line; and
the first PD and the second PD comprise a second two-stage fin structure, and wherein an upper portion of the second two-stage fin structure comprises multiple fin lines.

7. The device of claim 1, wherein:
the first pass-gate transistor comprises a first fin structure, and wherein an upper portion of the first fin structure comprises a first fin line and a second fin line over a bottom portion of the first fin structure; and
the second pass-gate transistor comprises a third fin line, a fourth fin line and a fifth fin line over the bottom portion of the two-stage fin structure.

8. The device of claim 7, wherein:
a width of the first fin line of the upper portion of the first fin structure is approximately equal to a width of the second fin line of the upper portion of the first fin structure; and
a width of the first fin line of the upper portion of the first fin structure is approximately equal to a width of the third fin line of the two-stage fin structure.

9. The device of claim 1, wherein:
one transistor of the first PU, the first PD, the second PU, the second PD comprises a third fin structure rectangular in shape; and
another transistor of the first PU, the first PD, the second PU, the second PD comprises a fourth fin structure, and wherein the fourth fin structure is a two-stage fin structure.

10. The device of claim 1, wherein:
the device is a six-transistor memory cell comprising four two-stage fin structures and four gate regions.

11. The device of claim 10, wherein:
the four two-stage fin structures are placed in parallel; and
at least one two-stage fin structure is orthogonal to one of the four gate regions.

12. A device comprising:
an isolation region formed in a substrate; and
a six-transistor memory cell over the substrate, wherein the six-transistor memory cell comprises four n-type transistors and two p-type transistors, and wherein:
    a first n-type transistor comprises a first two-stage fin structure comprising a bottom portion enclosed by the isolation region and an upper portion protruding above the isolation region, wherein a width of the bottom portion of the first two-stage fin structure is greater than a width of the upper portion of the first two-stage fin structure, wherein the upper portion of the first two-stage fin structure comprises multiple fin lines and a merge drain/source region of the first n-type transistor covers the multiple fin lines, and wherein a p-type doping concentration of an upper region of the bottom portion of the first two-stage fin structure is higher than a p-type doping concentration of an upper region of the upper portion of the first two-stage fin structure; and
    a first p-type transistor comprises a second two-stage fin structure comprising a bottom portion enclosed by the isolation region and an upper portion protruding above the isolation region, wherein a width of the bottom portion of the second two-stage fin structure is greater than a width of the upper portion of the second two-stage fin structure, wherein the upper portion of the second two-stage fin structure comprises a single fin line and a drain/source region of the first p-type transistor covers the single fin line, and wherein a width of the merged drain/source region of the first n-type transistor is greater than a width of the drain/source region of the first p-type transistor.

13. The device of claim 12, wherein:
the upper portion of the first two-stage fin structure comprises two fin lines.

14. The device of claim 12, wherein:
the upper portion of the first two-stage fin structure is rectangular in shape; and
the bottom portion of the first two-stage fin structure is rectangular in shape.

15. The device of claim 12, wherein:
the upper portion of the first two-stage fin structure is trapezoidal in shape; and
the bottom portion of the first two-stage fin structure is trapezoidal in shape.

16. A memory cell comprising:
a first inverter comprising:
    a first p-type pull-up transistor (PU) having a two-stage fin structure, wherein a width of a bottom portion of the two-stage fin structure is greater than a width of an upper portion of the two-stage fin structure, and wherein an n-type doping concentration of an upper region of the bottom portion of the two-stage fin structure is higher than an n-type doping concentration of an upper region of the upper portion of the two-stage fin structure; and
    a first n-type pull-down transistor (PD) having the two-stage fin structure, wherein the first PU is connected in series with the first PD;
a second inverter cross-coupled to the first inverter comprising:
    a second PU having the two-stage fin structure; and
    a second PD having the two-stage fin structure, wherein the second PU is connected in series with the second PD;
a first pass-gate transistor having the two-stage fin structure comprising first multiple fin lines, wherein the first pass-gate transistor is coupled between the first inverter and a first bit line, and wherein the first pass-gate transistor comprises a first merged drain/source region covering the first multiple fin lines; and
a second pass-gate transistor having the two-stage fin structure comprising second multiple fin lines, wherein the second pass-gate transistor is coupled between the second inverter and a second bit line, and wherein the second pass-gate transistor comprises a second merged drain/source region covering the second multiple fin lines.

17. The memory cell of claim 16, wherein:
the first PD is formed by two FinFETs connected in parallel;
the second PD is formed by two FinFETs connected in parallel;
the first pass-gate transistor is formed by two FinFETs connected in parallel; and
the second pass-gate transistor is formed by two FinFETs connected in parallel.

18. The memory cell of claim 16, wherein:
the first PU comprises a single fin line and the second PU comprises a single fin line.

19. The memory cell of claim 16, wherein the two-stage fin structure comprises:

a first stage having a first rectangular shape from a cross section view of a channel of the two-stage fin structure; and a second stage having a second rectangular shape from the cross section view of the channel of the two-stage fin structure, and wherein the first stage is stacked on the second stage.

20. The memory cell of claim 16, wherein:

the first merged drain/source region comprises a lower portion and an upper portion, wherein a sidewall of the lower portion of the first merged drain/source region is vertically aligned with a sidewall of the two-stage fin structure of the first pass-gate transistor and a width of the upper portion of the first merged drain/source region is greater than a width of the lower portion of the first merged drain/source region.

* * * * *